(12) United States Patent
Hashimoto

(10) Patent No.: US 11,501,985 B2
(45) Date of Patent: Nov. 15, 2022

(54) SUBSTRATE PROCESSING METHOD AND SUBSTRATE PROCESSING DEVICE

(71) Applicant: SCREEN Holdings Co., Ltd., Kyoto (JP)

(72) Inventor: Koji Hashimoto, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 17/161,745

(22) Filed: Jan. 29, 2021

(65) Prior Publication Data

US 2021/0151334 A1 May 20, 2021

Related U.S. Application Data

(63) Continuation of application No. 16/072,017, filed as application No. PCT/JP2017/006881 on Feb. 23, 2017, now Pat. No. 10,964,558.

(30) Foreign Application Priority Data

Mar. 8, 2016 (JP) .................................. 2016-044554

(51) Int. Cl.
*H01L 21/67* (2006.01)
*H01L 21/02* (2006.01)
*B08B 3/02* (2006.01)

(52) U.S. Cl.
CPC ........ *H01L 21/67051* (2013.01); *B08B 3/024* (2013.01); *H01L 21/02054* (2013.01);
(Continued)

(58) Field of Classification Search
CPC ............................................... H01L 21/67051
See application file for complete search history.

(56) References Cited

U.S. PATENT DOCUMENTS 6,193,798 B1    2/2001  Sumnitsch ..................... 118/52
8,075,731 B2   12/2011  Miya ........................ 156/345.33
(Continued)

FOREIGN PATENT DOCUMENTS

JP    2007-081311 A    3/2007
JP    2009-111219 A    5/2009
(Continued)

OTHER PUBLICATIONS

International Search Report dated Mar. 28, 2017 in corresponding PCT International Application No. PCT/JP2017/006881.
(Continued)

*Primary Examiner* — Jason Y Ko
(74) *Attorney, Agent, or Firm* — Ostrolenk Faber LLP

(57) ABSTRACT

A low surface tension liquid supply unit supplies a low surface tension liquid onto the upper surface of a substrate to form a liquid film of the low surface tension liquid on the substrate. An opening is formed in a central region of the liquid film of an organic solvent. The liquid film is removed from the upper surface of the substrate by expanding the opening. While a low surface tension liquid is supplied from the low surface tension liquid supply unit, to the liquid film, toward a liquid landing point set outside the opening, the liquid landing point is moved so as to follow the expansion of the opening. While an facing surface of a drying head faces a dry region set inside the opening to form a low-humidity space between the facing surface and the dry region, with the low-humidity space having a humidity lower than that outside the space, the dry region and the facing surface are moved so as to follow the expansion of the opening.

22 Claims, 14 Drawing Sheets

(52) U.S. Cl.
CPC .. *H01L 21/02057* (2013.01); *H01L 21/67028* (2013.01); *H01L 21/67034* (2013.01)

(56) References Cited

U.S. PATENT DOCUMENTS

| | | | |
|---|---|---|---|
| 8,109,282 B2 | 2/2012 | Miya et al. | 134/95.1 |
| 8,267,103 B2 | 9/2012 | Park et al. | 134/200 |
| 8,651,121 B2 | 2/2014 | Orii et al. | 134/134 |
| 8,696,825 B2 | 4/2014 | Miya et al. | 134/1.2 |
| 10,475,638 B2 | 11/2019 | Shinohara et al. | |
| 2007/0017555 A1 | 1/2007 | Sekiguchi et al. | 134/33 |
| 2009/0014028 A1 | 1/2009 | Hirota et al. | 134/1.3 |
| 2009/0205684 A1 | 8/2009 | Orii et al. | |
| 2011/0289795 A1 | 12/2011 | Ishibashi et al. | 34/467 |
| 2013/0174873 A1 | 7/2013 | Yoshibara et al. | |
| 2014/0127908 A1 | 5/2014 | Okutani | 438/694 |
| 2014/0259728 A1 | 9/2014 | Ishibashi et al. | 34/381 |
| 2014/0360536 A1 | 12/2014 | Kawabuchi et al. | 134/33 |
| 2015/0194301 A1 | 7/2015 | Uemura et al. | |
| 2015/0303078 A1 | 10/2015 | Ishibashi | |
| 2017/0047219 A1 | 2/2017 | Shinohara et al. | |
| 2017/0084470 A1 | 3/2017 | Suzuki et al. | |
| 2017/0186599 A1 | 6/2017 | Takahashi et al. | |
| 2017/0256392 A1 | 9/2017 | Maruyama | |
| 2017/0316961 A1 | 11/2017 | Nakamori et al. | |

FOREIGN PATENT DOCUMENTS

| | | |
|---|---|---|
| JP | 2009-212301 A | 9/2009 |
| JP | 2013-102238 A | 5/2013 |
| JP | 2013-140881 A | 7/2013 |
| JP | 2014-090015 A | 5/2014 |
| JP | 2015-133347 A | 7/2015 |
| JP | 2015-204427 A | 11/2015 |
| JP | 2015-213105 A | 11/2015 |
| KR | 10-2007-0062457 A | 6/2007 |
| KR | 10-2015-0005490 A | 1/2015 |
| TW | 201140675 A1 | 11/2011 |
| TW | I413201 B | 10/2013 |
| TW | I447799 B | 8/2014 |

OTHER PUBLICATIONS

Written Opinion dated Mar. 28, 2017 in corresponding PCT International Application No. PCT/JP2017/006881.

International Preliminary Report on Patentability (Chapter I) dated Sep. 20, 2018 with a Notification from the International Bureau (Form PCT/IB/326) in corresponding PCT International Application No. PCT/JP2017/006881 in Japanese.

International Preliminary Report on Patentability (Chapter I) dated Sep. 20, 2018 with a Notification from the International Bureau (Form PCT/IB/338) in corresponding PCT International Application No. PCT/JP2017/006881 in English.

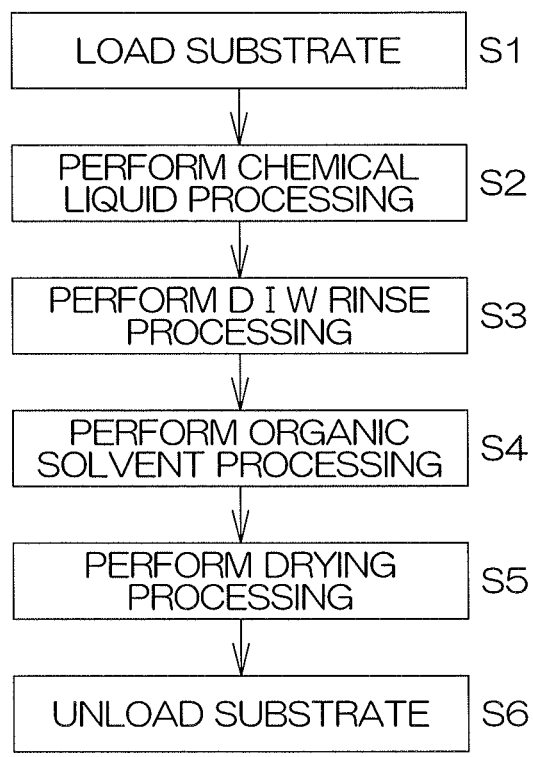

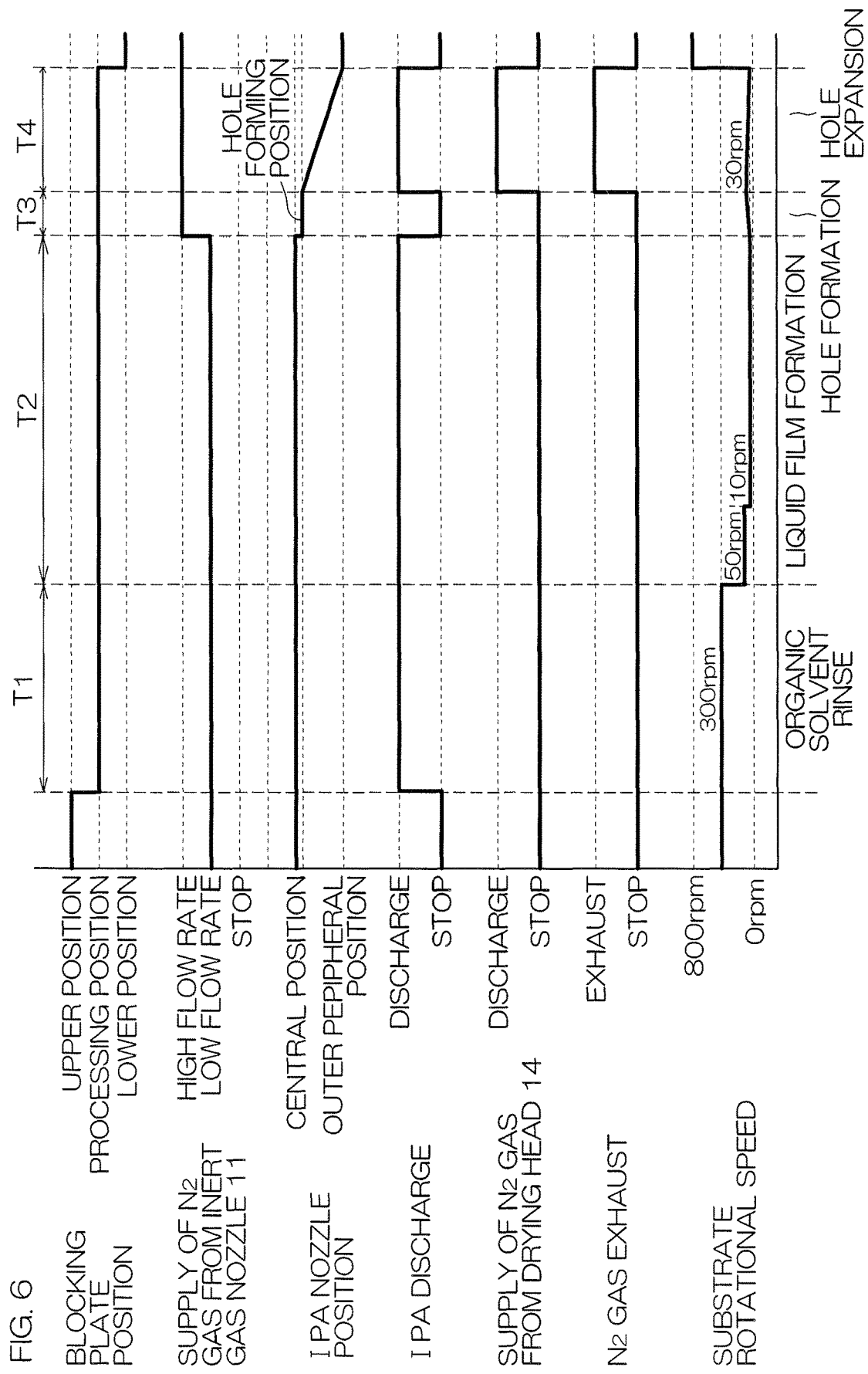

SUBSTRATE PROCESSING METHOD AND SUBSTRATE PROCESSING DEVICE

CROSS-REFERENCE TO RELATED APPLICATIONS

The present application is a continuation of U.S. patent application Ser. No. 16/072,017, filed Jul. 23, 2018, which is a 35 U.S.C. §§ 371 national phase conversion of PCT/JP2017/006881, filed Feb. 23, 2017, which claims priority to Japanese Patent Application No. 2016-044554, filed Mar. 8, 2016, the contents of both of which are incorporated herein by reference. The PCT International Application was published in the Japanese language.

TECHNICAL FIELD

The present invention relates to a substrate processing apparatus and a substrate processing method for processing a substrate with a liquid. Examples of substrates to be processed include semiconductor wafers, substrates for liquid crystal displays, substrates for plasma displays, substrates for field emission displays (FEDs), substrates for optical disks, substrates for magnetic disks, substrates for magneto-optical disks, substrates for photomasks, ceramic substrates, and substrates for solar cells.

BACKGROUND ART

In substrate processing performed by a single substrate processing type substrate processing apparatus that processes substrates one by one, for example, a chemical liquid is supplied to the substrate that is held almost horizontally by a spin chuck. Thereafter, a rinse liquid is supplied to the substrate, and the chemical liquid on the substrate is replaced with the rinse liquid. Thereafter, a spin-drying step is performed to remove the rinse liquid on the substrate.

When fine patterns are formed on the front surface of a substrate as shown in FIG. 16, there is a possibility that the rinse liquid that has entered into the patterns cannot be removed in a s spin-drying step. Accordingly, there is a possibility that a drying failure will occur. The liquid level (the interface between air and the liquid) of the rinse liquid that has entered into the patterns is formed in the pattern. Therefore, the surface tension of the liquid acts on contact positions between the liquid level and the patterns. If the surface tension is high, a pattern collapse tends to occur. Water, which is a typical rinse liquid, is high in surface tension. Accordingly, the pattern collapse in the s spin-drying step cannot be disregarded.

Accordingly, there has been proposed a technique of supplying isopropyl alcohol (IPA), which is a low surface tension liquid having lower surface tension than water. In this technique, water that has entered into patterns is replaced with IPA, and the IPA is removed thereafter to dry the upper surface of the substrate.

For example, the wafer cleaning apparatus disclosed in Patent Literature 1 includes a nozzle head having an IPA discharge nozzle and a nitrogen gas discharge nozzle which are provided at its distal end and a gas discharge head that covers almost the entire upper surface of a substrate and can discharge a low-humidity gas. Ina spin-drying step, while a substrate is rotated and IPA is discharged from the IPA discharge nozzle, the nozzle head is moved from the center of the substrate to its peripheral edge, thereby pushing a liquid film of IPA to outside the substrate owing to a centrifugal force.

In order to dry the upper surface of the substrate by evaporating the IPA remaining on the upper surface of the substrate after the liquid film is pushed outside by centrifugal force, a nitrogen gas is discharged from the nitrogen gas discharge nozzle when the nozzle head is moved from the center of the substrate to its peripheral edge. Alternatively, while the nozzle head is moved from the center of the substrate to its peripheral edge, a low-humidity gas is discharged from the gas discharge head toward the upper surface of the substrate.

CITATION LIST

Patent Literature

Patent Literature 1: United States Patent Application Publication No. 2009/205684

SUMMARY OF THE INVENTION

Technical Problem

In the wafer cleaning apparatus disclosed in Patent Literature 1, it is necessary to strongly spray nitrogen gas from the nitrogen discharge nozzle to the upper surface of the substrate in order to quickly evaporate any slight amount of IPA remaining on the upper surface of the substrate. However, strongly spraying nitrogen gas on the upper surface will cause local external force to act on patterns on the substrate. This may result in pattern collapse.

On the other hand, the gas discharge head covers almost the entire upper surface of the substrate. For this reason, the nozzle head must be moved between the gas discharge head and the upper surface of the substrate, and cannot be brought sufficiently close to the upper surface of the substrate. This may make it impossible to quickly dry the substrate.

Patent Literature 1 in FIG. 11 also discloses an arrangement in which a notch is provided on the gas discharge head to allow the gas discharge head to approach the upper surface of the substrate while avoiding interference with the nozzle head. However, in this configuration, nitrogen gas is continuously supplied from the gas discharge head to the entire upper surface of the substrate. Consequently, IPA fully evaporates locally before removal of a liquid film of IPA by centrifugal force, causing the liquid film to break apart. As a result, the substrate is exposed. This may cause liquid droplets to locally remain on the upper surface of the substrate. These liquid droplets continue to apply surface tension to patterns on the substrate until complete evaporation. This may cause pattern collapse.

It is, therefore, one object of the present invention to provide a substrate processing method and a substrate processing apparatus that can properly remove a low surface tension liquid from the upper surface of the substrate.

Solution to Problem

This invention provides a substrate processing method including a substrate holding step of horizontally holding a substrate, a liquid film forming step of forming a liquid film of a low surface tension liquid having a lower surface tension than water on an upper surface of the horizontally held substrate, an opening forming step of forming an opening in a central region of the liquid film of the low surface tension liquid, a liquid film removing step of removing the liquid film from the upper surface of the substrate by expanding the opening, a liquid landing point moving step of moving a liquid landing point, which is set outside the opening, following the expansion of the opening, while supplying a low surface tension liquid from a low surface tension liquid nozzle which supplies a low surface tension liquid, toward the liquid landing point to the liquid film, and a dry region moving step of moving a dry region, which is set inside the opening, and a facing surface of a drying head, which has a smaller planar view size than the substrate so as to follow the expansion of the opening, while causing the facing surface to face the dry region so as to form a low-humidity space between the facing surface and the dry region, the low-humidity space having a humidity lower than a humidity outside the space.

According to this method, in the space between the facing surface, which faces the dry region set inside the opening in the liquid film of a low surface tension liquid, and the dry region, a low-humidity space, which has a lower humidity than that outside the space, is formed. This makes it possible to quickly evaporate the low surface tension liquid remaining in the dry region.

The dry region and the facing surface move following the expansion of the opening in the liquid film. Therefore, the low surface tension liquid, which remains on the upper surface of the substrate after the liquid film of the low surface tension liquid is removed, can be quickly evaporated. In addition, because the dry region that the facing surface faces is relatively large, a local external force does not easily act on the upper surface of the substrate.

On the other hand, the facing surface has a smaller planar view size than the substrate. For this reason, it is possible to move the facing surface while disposing the drying head at a position avoiding the low surface tension liquid nozzle, that is, a position sufficiently close to the upper surface of the substrate. As a result, this makes it possible to more quickly evaporate the low surface tension liquid remaining in the dry region.

The dry region is set inside the opening, and the liquid landing point is set outside the opening. For this reason, it is possible to supply a sufficient amount of low surface tension liquid to the liquid film while restricting the natural evaporation of the low surface tension liquid from the liquid film until the liquid film is removed from the upper surface of the substrate. Accordingly, it is possible to suppress the occurrence of liquid film breaking apart caused by local evaporation of the liquid film before the liquid film is removed by the expansion of the opening.

Therefore, the low surface tension liquid can be satisfactorily removed from the upper surface of the substrate.

According to a preferred embodiment of the present invention, the dry region moving step includes a step of moving the dry region along a moving locus of the liquid landing point so as to follow the movement of the liquid landing point. This makes it possible to quickly evaporate the low surface tension liquid by using the drying head before the natural evaporation of the low surface tension liquid landed at the liquid landing point.

According to a preferred embodiment of the present invention, the opening forming step includes an inert gas spraying step of spraying an inert gas toward the central region of the substrate. In addition, the inert gas spraying step is continued until completion of the liquid film removing step.

According to this method, in the opening forming step, the opening can be efficiently and reliably formed in the central region by spraying an inert gas toward the central region of the liquid film. In addition, spraying of the inert gas is continued until the completion of a liquid film removing step. As a result, the expansion of the opening is promoted, and the low surface tension liquid can be removed to the outside of the substrate more quickly.

According to a preferred embodiment of the present invention, the substrate processing method further includes a substrate rotating step of rotating the substrate in parallel with the liquid film removing step.

According to this method, because the substrate is rotated in parallel with a liquid film removing step, it is possible to promote the expansion of the opening by using the centrifugal force generated by the rotation of the substrate. As a result, the low surface tension liquid can be removed to outside the substrate more quickly. In addition, as the substrate rotates, the liquid landing point of the low surface tension liquid is scanned over the substrate outside the opening of the liquid film, and the dry region is scanned over the substrate inside the opening. Thereby, it is possible to apply uniform drying processing to the entire upper surface of the substrate.

According to a preferred embodiment of the present invention, the substrate rotating step includes a rotation decelerating step of gradually decelerating rotation of the substrate.

At an initial stage of a liquid film removing step, because the opening of the liquid film is small, the dry region is located near the central region of the upper surface of the substrate. In contrast to this, at a final stage of the liquid film removing step, because the opening of the liquid film has become large, the dry region is located near the peripheral edge of the upper surface of the substrate.

If the rotational speed of the substrate is constant in a liquid film removing step, the distance that the dry region relatively moves on the upper surface of the substrate per unit time in the substrate rotating direction at a final stage of the liquid film removing step is larger than the distance that the dry region relatively moves on the upper surface of the substrate per unit time in the substrate rotating direction at an initial stage of the liquid film removing step. Accordingly, at the final stage of the liquid film removing step, the substrate upper surface drying time per unit area, that is, the time in which the drying head faces the facing surface, is shorter than that at the initial stage of the liquid film removing step.

Gradually decelerating the rotation of the substrate in a substrate rotating step can reduce the distance that the dry region relatively moves per unit time in the substrate rotating direction at the final stage of the liquid film removing step, and can prolong the substrate upper surface drying time per unit area. Thereby, it is possible to reduce the difference in substrate upper surface drying time per unit area between the initial stage and the final stage of the liquid film removing step. Therefore, according to this method, drying unevenness on the upper surface of the substrate can be reduced.

According to a preferred embodiment of the present invention, the dry region is set such that a partial region larger than a half of the region is located downstream with respect to the liquid landing point in a substrate rotating direction. As a result, it is possible to further reliably evaporate the low surface tension liquid landed on the liquid landing point before the natural evaporation of the low surface tension liquid.

According to a preferred embodiment, the dry region has a sectorial planar shape, the pivot point of the sectorial shape is located at a position far from the liquid landing point, and an arc of the sectorial shape is located close to the liquid landing point so as to extend along a substrate rotating direction.

According to this method, in the dry region having the nearly sectorial planar shape, the pivot point of the sectorial shape is located at a position far from the liquid landing point, and the arc of the sectional shape is located close to the liquid landing point. Thereby, the arc of the sectorial shape is located closer to the peripheral edge side of the substrate than the pivot point, so that it is possible to reduce the difference in time in which each portion of the upper surface of the substrate faces the facing surface of the drying head, that is, the difference in drying time. Accordingly, drying unevenness on the upper surface of the substrate can be reduced.

According to a preferred embodiment of the present invention, the low surface tension liquid nozzle and the drying head are supported by a common moving member, and the liquid landing point moving step and the dry region moving step each include a step of moving the moving member.

According to this method, in a liquid landing point moving step and a dry region moving step, the distance between the low surface tension liquid nozzle and the drying head can be kept constant by moving the moving member that commonly supports the low surface tension liquid nozzle and the drying head. Accordingly, the entire upper surface of the substrate can be dried under uniform conditions, and therefore drying unevenness on the upper surface of the substrate can be reduced According to a preferred embodiment of the present invention, the drying head is an inert gas supply head which supplies an inert gas. Therefore, the humidity of the low-humidity space can be reduced by using an inert gas. Thereby, the low surface tension liquid can be quickly evaporated from the upper surface of the substrate, and therefore the upper surface of the substrate can be quickly dried.

According to a preferred embodiment of the present invention, the facing surface is recessed upward from the upper surface of the substrate to define an inert gas retaining space, and the inert gas supply head includes an inert gas introduction port which supplies an inert gas to the inert gas retaining space.

According to this method, the facing surface is recessed upward from the upper surface of the substrate to define the inert gas retaining space. The inert gas supplied from the inert gas introduction port is retained in the inert gas retaining space. Thereby, it is possible to evaporate the low surface tension liquid remaining on the upper surface of the substrate by using the inert gas retained in the inert gas retaining space. Therefore, the low surface tension liquid in the dry region can be evaporated more quickly.

According to a preferred embodiment of the present invention, the inert gas supply head further includes an exhaust port which exhausts the inert gas retaining space.

According to this method, the exhaust port exhausts the inert gas retaining space. Thus, the low surface tension liquid evaporated from the upper surface of the substrate into steam is removed from the low-humidity space via the inert gas retaining space. Accordingly, the low-humidity space can be kept at a lower humidity, so that the low surface tension liquid in the dry region can be evaporated more quickly.

According to a preferred embodiment of the present invention, the facing surface is a flat surface which is parallel to the upper surface of the substrate, and a plurality of inert gas discharge ports is formed in the facing surface. In addition, the inert gas supply head includes an inert gas retaining space which communicates with the plurality of inert gas discharge ports and an inert gas introduction port which supplies an inert gas to the inert gas retaining space.

According to this method, an inert gas from the inert gas introduction port is supplied to the inert gas retaining space. The inert gas retaining space communicates with the plurality of inert gas discharge ports formed in the facing surface that is a flat surface parallel to the upper surface of the substrate. Therefore, as compared with the case where the inert gas is supplied from one discharge port, the inert gas can be uniformly supplied over a wide range, and therefore it is possible to forma low-humidity space with less humidity unevenness. Accordingly, the low surface tension liquid in the dry region can be quickly evaporated, and drying unevenness on the upper surface of the substrate can be reduced. In addition, using the plurality of inert gas discharge ports can reduce the force of an inert gas supplied onto the upper surface of the substrate. Therefore, it is possible to suppress a large external force from locally acting on the upper surface of the substrate.

According to a preferred embodiment of the present invention, the drying head includes a heater unit which heats the dry region. Thereby, it is possible to further promote the evaporation of the low surface tension liquid in the dry region.

According to a preferred embodiment of the present invention, the drying head includes an exhaust unit which exhausts the space between the facing surface and the dry region.

According to this method, steam of the low surface tension liquid can be removed from the low-humidity space by the exhaust unit that exhausts the space between the facing surface and the dry region. Accordingly, the low surface tension liquid in the dry region can be evaporated more quickly.

According to a preferred embodiment of the present invention, a substrate processing apparatus includes a substrate holding unit which holds a substrate horizontally, a low surface tension liquid supply unit which supplies a low surface tension liquid having a lower surface tension than water onto the upper surface of the substrate held by the substrate holding unit, an opening forming unit which forms an opening in a central region of a liquid film of the low surface tension liquid formed on the upper surface of the substrate held by the substrate holding unit, a drying head which has a facing surface facing the upper surface of the substrate held by the substrate holding unit, and having a smaller planar view size than the substrate, and dries the upper surface of the substrate by forming a low-humidity space between the facing surface and the upper surface of the substrate, the low-humidity space having a humidity lower than a humidity outside the space, and a drying head moving unit moves the drying head along the upper surface of the substrate held by the substrate holding unit.

According to this configuration, a liquid film of a low surface tension liquid is formed on the substrate, and an opening is formed in the central region of the liquid film. A low-humidity space is formed in the space between the facing surface, which faces the dry region set inside the opening in the liquid film, and the dry region, with the low-humidity space having a humidity lower than that outside the space. This makes it possible to quickly evaporate the low surface tension liquid remaining in the dry region.

According to a preferred embodiment of the present invention, the substrate processing apparatus further includes a controller which controls the low surface tension liquid supply unit, the opening forming unit, the drying head, and the drying head moving unit. The controller is programmed so as to execute a liquid film forming step of forming a liquid film of a low surface tension liquid on the upper surface of the substrate by causing the low surface tension liquid supply unit to supply a low surface tension liquid onto the upper surface of the substrate, an opening forming step of causing the opening forming unit to form an opening in a central region of the liquid film, a liquid film removing step of removing the liquid film from the upper surface of the substrate by expanding the opening, a liquid landing point moving step of setting a liquid landing point of the low surface tension liquid supplied from the low surface tension liquid supply unit outside the opening and moving the liquid landing following the expansion of the opening, and a dry region moving step of causing the facing surface of the drying head to face a dry region set inside the opening and moving the dry region and the facing surface following expansion of the opening.

According to this configuration, the dry region and the facing surface move following the expansion of the opening in the liquid film of the low surface tension liquid. Therefore, the low surface tension liquid, which remains on the upper surface of the substrate after the liquid film of the low surface tension liquid is removed, can be quickly evaporated. In addition, because the dry region that the facing surface faces is relatively large, a local external force does not easily act on the upper surface of the substrate.

On the other hand, the facing surface has a smaller planar view size than the substrate. For this reason, it is possible to move the facing surface while disposing the drying head at a position avoiding the low surface tension liquid nozzle, that is, a position sufficiently close to the upper surface of the substrate. Accordingly, the low surface tension liquid remaining in the dry region can be evaporated more quickly.

Because the dry region is set inside the opening and the liquid landing point is set outside the opening, it is possible to supply a sufficient amount of low surface tension liquid to the liquid film while restricting the natural evaporation of the low surface tension liquid from the liquid film until the liquid film is removed from the upper surface of the substrate. Accordingly, it is possible to suppress the occurrence of liquid film breaking apart caused by local evaporation of the liquid film before the liquid film is removed by the expansion of the opening.

Therefore, the low surface tension liquid can be satisfactorily removed from the upper surface of the substrate.

According to a preferred embodiment of the present invention, the controller is programmed so as to execute a step of moving the dry region along a moving locus of the liquid landing point so as to follow the movement of the liquid landing point in the dry region moving step. This makes it possible to quickly evaporate the low surface tension liquid by using the drying head before the natural evaporation of the low surface tension liquid landed at the liquid landing point.

According to a preferred embodiment of the present invention, the opening forming unit includes an inert gas supply unit which sprays an inert gas toward the central region of the substrate held by the substrate holding unit. In addition, the controller is programmed so as to execute an inert gas spraying step of supplying an inert gas from the inert gas supply unit in the opening forming step and continue the inert gas spraying step until completion of the liquid film removing step.

According to this configuration, in the opening forming step, the opening can be efficiently and reliably formed in the central region by spraying an inert gas toward the central region of the liquid film. In addition, spraying of the inert gas is continued until the completion of a liquid film removing step. As a result, the expansion of the opening is promoted, and the low surface tension liquid can be removed to the outside of the substrate more quickly.

According to a preferred embodiment of the present invention, the substrate processing apparatus further includes a substrate rotating unit which rotates the substrate held by the substrate holding unit around a predetermined rotation axis along a vertical direction. In addition, the controller is programmed so as to execute a substrate rotating step of rotating the substrate in parallel with the liquid film removing step.

According to this configuration, because the substrate is rotated in parallel with a liquid film removing step, it is possible to promote the expansion of the opening by using the centrifugal force generated by the rotation of the substrate. As a result, the low surface tension liquid can be removed to the outside of the substrate more quickly. In addition, as the substrate rotates, the liquid landing point of the low surface tension liquid is scanned over the substrate outside the opening of the liquid film, and the dry region is scanned over the substrate inside the opening. Thereby, it is possible to apply uniform drying processing to the entire upper surface of the substrate.

According to a preferred embodiment of the present invention, the controller is programmed so as to execute a rotation decelerating step of decelerating rotation of the substrate in the substrate rotating step.

According to this configuration, in the substrate rotating step executed in parallel with the liquid film removing step, drying unevenness on the upper surface of the substrate can be reduced by gradually decelerating the rotation of a substrate.

According to a preferred embodiment of the present invention, the controller is programmed so as to set the dry region such that a partial region larger than a half of the region is located downstream with respect to the liquid landing point in a substrate rotating direction. Thereby, it is possible to further reliably evaporate the low surface tension liquid before the natural evaporation of the low surface tension liquid landed at the liquid landing point.

According to a preferred embodiment of the present invention, the facing surface has a sectorial planar shape, a pivot point of the sectorial shape is located at a position far from the liquid landing point, and the arc of the sectorial shape is located close to the liquid landing point so as to extend along a substrate rotating direction.

According to this configuration, on the facing surface having the sectorial planar shape, the pivot point of the sectorial shape is located at a position far from the liquid landing point, and the arc of the sectional shape is located close to the liquid landing point. Thereby, it is possible to dispose the arc, which is larger than the pivot point in the substrate rotating direction, closer to the peripheral edge side of the substrate than the pivot point. Accordingly, the arc of the sectorial shape is located on the peripheral edge side of the substrate, so that it is possible to reduce the difference in time in which each portion of the upper surface of the substrate faces the facing surface of the drying head, that is, the difference in drying time. Accordingly, drying unevenness on the upper surface of the substrate can be reduced.

According to a preferred embodiment of the present invention, the low surface tension liquid supply unit includes a low surface tension liquid nozzle which supplies a low surface tension liquid toward the upper surface of the substrate held by the substrate holding unit. In addition, the substrate processing apparatus further includes a moving member which commonly supports the low surface tension liquid nozzle and the drying head and moves the low surface tension liquid nozzle and the drying head above the substrate. In addition, the drying head moving unit moves the moving member.

According to this configuration, the distance between the low surface tension liquid nozzle and the drying head is kept constant by moving the moving member that commonly supports the low surface tension liquid nozzle and the drying head. Accordingly, the entire upper surface of the substrate can be dried under uniform conditions, and therefore drying unevenness can be reduced.

According to a preferred embodiment of the present invention, the drying head is an inert gas supply head which supplies an inert gas. Therefore, the humidity of the low-humidity space can be reduced by using an inert gas. Thereby, the low surface tension liquid can be quickly evaporated from the upper surface of the substrate, and therefore the upper surface of the substrate can be quickly dried.

According to a preferred embodiment of the present invention, the facing surface is recessed upward from the upper surface of the substrate held by the substrate holding unit to define an inert gas retaining space. In addition, the inert gas supply head includes an inert gas introduction port which supplies an inert gas to the inert gas retaining space.

According to this configuration, the facing surface is recessed upward from the upper surface of the substrate to define the inert gas retaining space. The inert gas supplied from the inert gas introduction port is retained in the inert gas retaining space. Thereby, it is possible to evaporate the low surface tension liquid remaining on the upper surface of the substrate by using the inert gas retained in the inert gas retaining space. Therefore, the low surface tension liquid on the upper surface of the substrate can be evaporated more quickly.

According to a preferred embodiment of the present invention, the inert gas supply head further includes an exhaust port which exhausts the inert gas retaining space.

According to this arrangement, the low surface tension liquid evaporated from the upper surface of the substrate into steam is removed from the low-humidity space via the inert gas retaining space by using the exhaust port that exhausts the inert gas retaining space. Thereby, the low-humidity space can be kept at a lower humidity, so that the low surface tension liquid on the upper surface of the substrate can be evaporated more quickly.

According to a preferred embodiment of the present invention, the facing surface is a flat surface parallel to the upper surface of the substrate, and a plurality of inert gas discharge ports are formed in the facing surface. In addition, the inert gas supply head includes an inert gas retaining space communicating with the plurality of inert gas discharge ports and an inert gas introduction port which supplies an inert gas to the inert gas retaining space.

According to this configuration, an inert gas from the inert gas introduction port is supplied to the inert gas retaining space. The inert gas retaining space communicates with the plurality of inert gas discharge ports formed in the facing surface that is a flat surface parallel to the upper surface of the substrate. Therefore, as compared with the case where the inert gas is supplied from one discharge port, the inert gas can be uniformly supplied over a wide range, and therefore it is possible to form a low-humidity space with less humidity unevenness. Therefore, the low surface tension liquid on the upper surface of the substrate can be evaporated uniformly and quickly. In addition, using the plurality of inert gas discharge ports can reduce the force of an inert gas supplied onto the upper surface of the substrate. Therefore, it is possible to suppress a large external force from locally acting on the upper surface of the substrate.

According to a preferred embodiment of the present invention, the drying head includes a heater unit which heats the upper surface of the substrate held by the substrate holding unit. Thereby, it is possible to further promote the evaporation of the low surface tension liquid on the upper surface of the substrate.

According to a preferred embodiment of the present invention, the drying head includes an exhaust unit which exhausts the space between the facing surface and the upper surface of the substrate held by the substrate holding unit.

According to this arrangement, steam of the low surface tension liquid can be removed from the low-humidity space by the exhaust unit that exhausts the space between the facing surface and the upper surface of the substrate. Accordingly, the low surface tension liquid on the upper surface of the substrate can be evaporated more quickly.

The above and other objects, features, and effects of the present invention will become more apparent from the following detailed description of the preferred embodiments with reference to the attached drawings.

BRIEF DESCRIPTION OF THE DRAWINGS

FIG. 5 is a flowchart for explaining an example of substrate processing by the substrate processing apparatus.

FIG. 6 is a timing chart for explaining the details of organic solvent processing (step S4 in FIG. 5).

DETAILED DESCRIPTION OF THE PREFERRED EMBODIMENTS

First Preferred Embodiment

Figure 1:
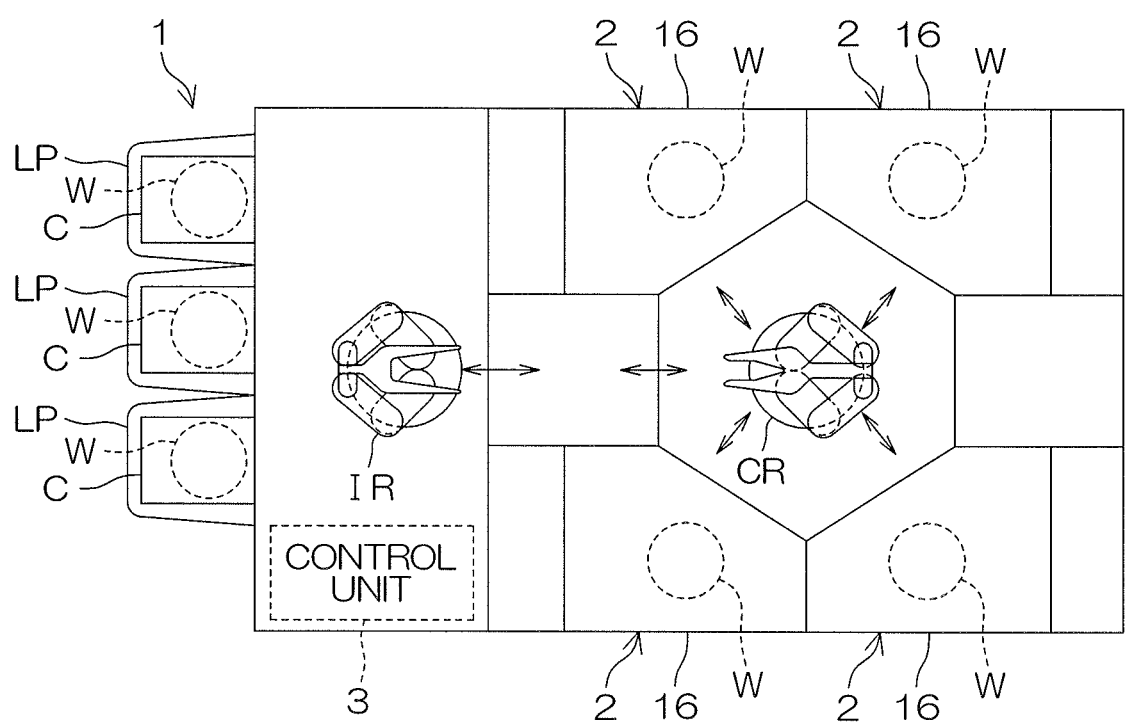
FIG. 1 is an illustrative plan view for explaining the internal layout of a substrate processing apparatus according to a first preferred embodiment of the present invention.
Figure 16:
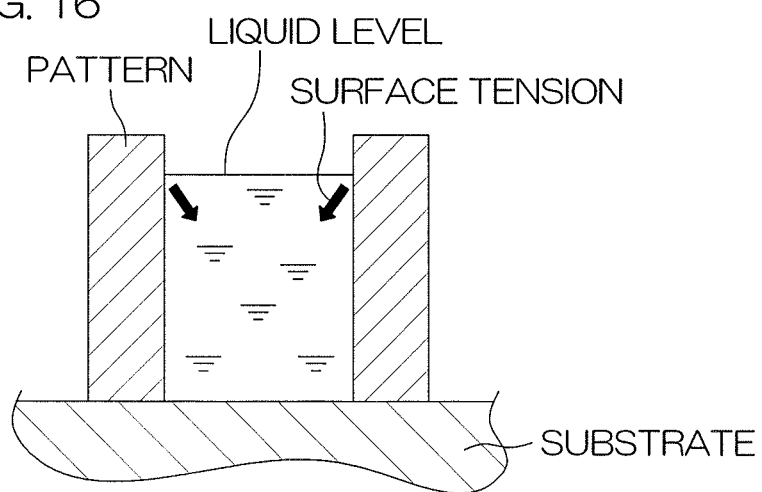
FIG. 16 is an illustrative sectional view for explaining the principle of pattern collapse caused by surface tension.

FIG. 1 is an illustrative plan view for explaining the internal layout of a substrate processing apparatus 1 according to the first preferred embodiment of the present invention. The substrate processing apparatus 1 is a single substrate processing type apparatus that processes substrates W such as silicon wafers one by one. In this preferred embodiment, the substrate W is a disk-shaped substrate. The substrate W has a diameter of, for example, 300 mm. Fine patterns (see FIG. 16) are formed on the front surface of the substrate W. The substrate processing apparatus 1 includes a plurality of processing units 2 that process the substrates W with a processing liquid, load ports LP on which carriers C that accommodate the plurality of wafers W to be processed by the processing units 2 are mounted, transfer robots IR and CR that transfer the substrates W between the load ports LP and the processing units 2, and a controller 3 that controls the substrate processing apparatus 1. The transfer robot IR transfers the substrates W between the carriers C and the transfer robot CR. The transfer robot CR transfers the substrates W between the transfer robot IR and the processing units 2. For example, the plurality of processing units 2 have the same arrangement.

Figure 2:
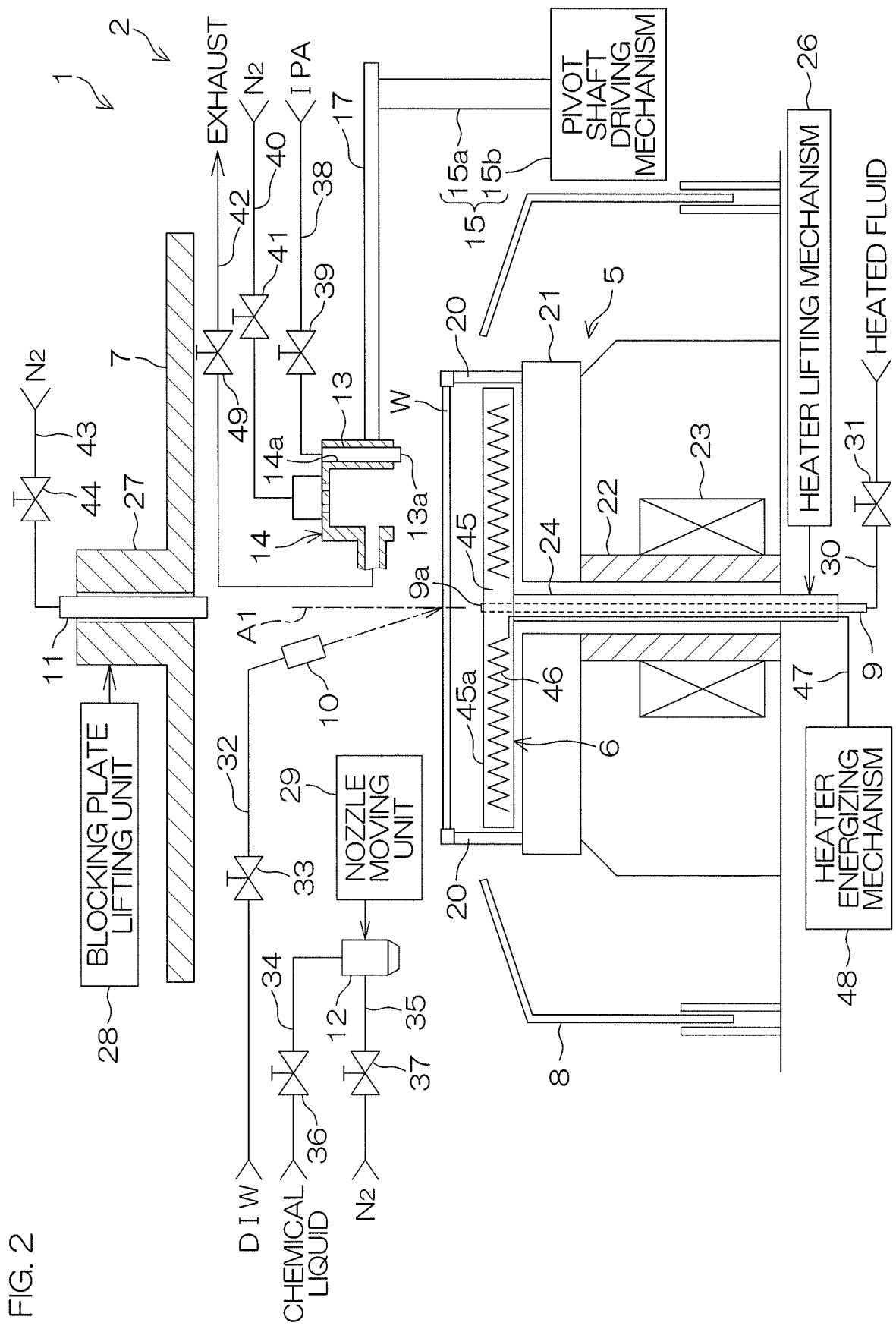
FIG. 2 is an illustrative sectional view for explaining an example of the configuration of a processing unit provided for the substrate processing apparatus.

FIG. 2 is an illustrative sectional view for explaining an example of the configuration of each processing unit 2. The processing unit 2 includes a spin chuck 5 that rotates one substrate W around a vertical rotation axis A1 passing through the center of the substrate W while holding the substrate W in a horizontal posture. The spin chuck 5 is isolated from the outside by a wall surface (not shown). The processing unit 2 further includes a heater mechanism 6 that heats the substrate W from the lower surface (the principal surface on the lower side) side, a blocking plate 7 that faces the upper surface (the principal surface on the upper side) of the substrate W to block the atmosphere between the blocking plate 7 and the substrate W from the surrounding atmosphere, a cylindrical cup 8 that surrounds the spin chuck 5, and a lower surface nozzle 9 that supplies a processing fluid to the lower surface of the substrate W.

The processing unit 2 further includes a DIW nozzle 10 that supplies deionized water (DIW) as a rinse liquid to the upper surface of the substrate W, an inert gas nozzle 11 that supplies an inert gas such as nitrogen gas ($N_2$) to the central region of the upper surface of the substrate W, and a moving nozzle 12 that can move above the substrate W. The central region of the upper surface of the substrate W is a region including a central portion of the upper surface of the substrate W which includes a position intersecting with the rotation axis A1 on the upper surface of the substrate W and a portion near the central portion.

The processing unit 2 further includes an organic solvent nozzle 13 that supplies an organic solvent (for example, IPA) as a low surface tension liquid having a lower surface tension than water onto the upper surface of the substrate W and a drying head 14 that dries the upper surface of the substrate W by supplying an inert gas such as nitrogen gas onto the upper surface of the substrate W. In this preferred embodiment, the drying head 14 is an inert gas supply head that supplies an inert gas.

The processing unit 2 further includes a chamber 16 (see FIG. 1) accommodating the cup 8. Although illustration is omitted, a loading/unloading port to load/unload the substrate W is formed in the chamber 16, and the chamber 16 includes a shutter unit that opens/closes the loading/unloading port.

The spin chuck 5 includes chuck pins 20, a spin base 21, a rotating shaft 22, and an electric motor 23 that rotates the substrate W around the rotation axis A1. The chuck pins 20 and the spin base 21 are included in a substrate holding unit that horizontally holds the substrate W. The substrate holding unit is also called the substrate holder. The rotating shaft 22 and the electric motor 23 are included in a substrate rotating unit that rotates the substrate W held by the chuck pins 20 and the spin base 21 around the rotation axis A1.

The rotating shaft 22 extends in the vertical direction along the rotation axis A1, and is a hollow shaft in this preferred embodiment. The upper end of the rotating shaft 22 is coupled to the center of the lower surface of the spin base 21. The spin base 21 has a disc shape along the horizontal direction. The plurality of chuck pins 20 that grip the substrate W are arranged on a peripheral edge portion of the upper surface of the spin base 21 at intervals in the circumferential direction.

The heater mechanism 6 has a hot plate form, and includes a disk-shaped plate main body 45 and a heater 46 supported by the plate main body 45. The heater mechanism 6 is disposed above the spin base 21. A lifting shaft 24 extending in the vertical direction along the rotation axis A1 is coupled to the lower surface of the heater mechanism 6. The lifting shaft 24 extends through a through hole formed in the central portion of the spin base 21 and the hollow rotating shaft 22. The lower end of the lifting shaft 24 extends lower than the lower end of the rotating shaft 22. A heater lifting mechanism 26 is coupled to the lower end of the lifting shaft 24. Actuating the heater lifting mechanism 26 will vertically move the heater mechanism 6 between a lower position near the upper surface of the spin base 21 and an upper position near the lower surface of the substrate W.

The heater 46 may be a resistive element incorporated in the plate main body 45. When the heater 46 is energized, a heating surface 45a as the upper surface of the plate main body 45 is heated to a temperature higher than room temperature (for example, 20° C. to 30° C.). A power feeder 47 for the heater 46 extends through the lifting shaft 24. A heater energizing mechanism 48 that supplies power to the heater 46 is connected to the power feeder 47. The heater energizing mechanism 48 includes, for example, a power supply unit.

The lower surface nozzle 9 extends through the hollow lifting shaft 24. The lower surface nozzle 9 extends through the heater mechanism 6. The lower surface nozzle 9 has, in its upper end, a discharge port 9a facing the center of the lower surface of the substrate W. A heated fluid such as heated water is supplied from a heated fluid source to the lower surface nozzle 9 via a heated fluid supply pipe 30. A heated fluid valve 31 is interposed in the heated fluid supply pipe 30 so as to open and close its flow path. Heated water is water higher in temperature than room temperature. Heated water has a temperature of, for example, 80° C. to 85° C. A heated fluid is not limited to heated water, and may be a gas such as high-temperature nitrogen gas. A heated fluid may be any fluid that can heat the substrate W.

The blocking plate 7 is formed into a disk shape having a diameter almost equal to or larger than that of the substrate W. The blocking plate 7 is disposed almost horizontally above the spin chuck 5. A hollow shaft 27 is fixed to the surface of the blocking plate 7 which is located on the opposite side to the surface facing the upper surface of the substrate W.

A blocking plate lifting unit 28, which raises and lowers the blocking plate 7 fixed to the hollow shaft 27 by raising and lowering the hollow shaft 27 along the vertical direction, is coupled to the hollow shaft 27. The blocking plate lifting unit 28 can position the blocking plate 7 at an arbitrary position (height) between a lower position and an upper position. The blocking plate lifting unit 28 includes, for example, a ball screw mechanism (not shown) and an electric motor (not shown) that provides a driving force to the ball screw mechanism.

The inert gas nozzle 11 can supply an inert gas such as nitrogen gas ($N_2$) toward the central region of the upper surface of the substrate W. An inert gas is not limited to nitrogen gas, and is any gas that is not reactive with respect to the front surface and patterns of the substrate W. An inert gas is, for example, a rare gas such as argon. A first inert gas supply pipe 43 that supplies an inert gas such as nitrogen gas is coupled to the inert gas nozzle 11. A first inert gas valve 44 is interposed in the first inert gas supply pipe 43 to open and close its flow path.

In this preferred embodiment, the DIW nozzle 10 is a fixed nozzle disposed to discharge DIW toward the rotation center of the upper surface of the substrate W. DIW is supplied from a DIW source to the DIW nozzle 10 via a DIW supply pipe 32. A DIW valve 33 is interposed in the DIW supply pipe 32 to open and close its flow path. The DIW nozzle 10 need not be a fixed nozzle and may be a moving nozzle that moves at least in the horizontal direction. Alternatively, the DIW nozzle 10 may be a rinse liquid nozzle that supplies a rinse liquid other than DIW. The rinse liquid may be carbonated water, electrolyzed ion water, ozone water, hydrochloric acid water having a dilute concentration (for example, about 10 ppm to 100 ppm), or reduction water (hydrogenated water), or the like.

The moving nozzle 12 is moved in the horizontal and vertical directions by a nozzle moving unit 29. The moving nozzle 12 horizontally moves between a position to face the rotation center of the upper surface of the substrate W and a home position (retracted position) that does not face the upper surface of the substrate W. The home position is a position outside the spin base 21 in a plan view, more specifically, may be a position outside the cup 8. The moving nozzle 12 can be brought closer to the upper surface of the substrate W and can be retracted above from the upper surface of the substrate W by being moved in the vertical direction. The nozzle moving unit 29 includes, for example, a pivot shaft extending along the vertical direction, an arm coupled to the pivot shaft and horizontally extending, and an arm driving mechanism that drives the arm.

In this preferred embodiment, the moving nozzle 12 has the function of a chemical liquid nozzle that supplies a chemical liquid such as acid or alkali. More specifically, the moving nozzle 12 may have a two-fluid nozzle form that can discharge a liquid and a gas while mixing them. A two-fluid nozzle can be used as a straight nozzle by being operated to discharge a liquid while a supply of gas is stopped. A chemical liquid supply pipe 34 and a second inert gas supply pipe 35 are coupled to the moving nozzle 12. A chemical liquid valve 36 is interposed in the chemical liquid supply pipe 34 to open and close its flow path. A second inert gas valve 37 is interposed in the second inert gas supply pipe 35 to open and close its flow path. A chemical liquid such as acid or alkali is supplied from a chemical liquid source to the chemical liquid supply pipe 34. Nitrogen gas as an inert gas is supplied from an inert gas source to the second inert gas supply pipe 35.

Specific examples of the chemical liquid are etchants and cleaning liquids. More specifically, the chemical liquid is not limited to hydrofluoric acid, and may be a liquid containing at least one of sulfuric acid, acetic acid, nitric acid, hydrochloric acid, hydrofluoric acid, aqueous ammonia, hydrogen peroxide, organic acid (for example, citric acid or oxalic acid), organic alkali (for example, tetramethylammonium hydroxide (TMAH)), surfactant, and corrosion inhibitor. Examples of chemical liquids obtained by mixing them are sulfuric acid/hydrogen peroxide mixture (SPM), ammonia-hydrogen peroxide mixture (SC1), and the like.

The organic solvent nozzle 13 is an example of a low surface tension liquid nozzle that supplies a low surface tension liquid onto the upper surface of the substrate W. The low surface tension liquid nozzle is included in a low surface tension liquid supply unit that supplies a low surface tension liquid onto the upper surface of the substrate W. As a low surface tension liquid, it is possible to use an organic solvent, other than IPA, which has smaller surface tension than water and is not chemically reactive (exhibits poor reactivity) with respect to the upper surface of the substrate W and the patterns (see FIG. 16) formed on the substrate W. More specifically, as a low surface tension liquid, it is possible to use a liquid containing at least one of IPA, hydrofluoroether (HFE), methanol, ethanol, acetone, and trans-1,2-dichloroethylene. In addition, the low surface tension liquid need not consist of only monocomponents. In other words, the low surface tension liquid may be a liquid mixed with other components. For example, the low surface tension liquid may be a mixture of an IPA liquid and pure water or a mixture of an IPA liquid and an HFE liquid.

The processing unit 2 further includes a moving member 17 that supports the drying head 14 and a moving unit 15 that moves the moving member 17. The moving member 17 includes an arm extending in the horizontal direction. The moving unit 15 includes a pivot shaft 15a extending in the vertical direction and coupled to the moving member 17 and a pivot shaft driving mechanism 15b that drives the pivot shaft 15a. The pivot shaft driving mechanism 15b swings the moving member 17 along the upper surface of the substrate W by causing the pivot shaft 15a to pivot about a vertical pivot axis, and vertically moves the moving member 17 by raising and lowering the pivot shaft 15a along the vertical direction. As the moving member 17 swings and is raised/lowered, the drying head 14 moves in the horizontal and vertical directions.

The pivot shaft driving mechanism 15b includes, for example, a ball screw mechanism (not shown), a first electric motor (not shown) that provides a driving force to the ball screw mechanism to raise and lower the pivot shaft 15a, and a second electric motor (not shown) that causes the pivot shaft 15a to pivot about a pivot axis.

The organic solvent nozzle 13 is fixed to the drying head 14. More specifically, referring to FIGS. 3A and 3B which are described later, the organic solvent nozzle 13 is fixed in a through hole 14a through which the drying head 14 vertically extends, in a state where a discharge port 13a of the organic solvent nozzle 13 is faced the upper surface of the substrate W. Accordingly, the moving member 17 supports the drying head 14 and the organic solvent nozzle 13 in common, and the moving member 17 vertically moves them above the substrate W.

The organic solvent nozzle 13 can move between a central position to face the rotation center of the upper surface of the substrate W and a home position (retracted position) that does not face the upper surface of the substrate W. The rotation center of the upper surface of the substrate W is a position intersecting with the rotation axis A1 of the upper surface of the substrate W. The home position is a position outside the spin base 21 in a plan view. More specifically, the home position may be a position outside the cup 8. Likewise, the drying head 14 can move between a central position to face the rotation center of the upper surface of the substrate W and a home position (retracted position) that does not face the upper surface of the substrate W. The organic solvent nozzle 13 and the drying head 14 can be brought closer to the upper surface of the substrate W and can be retracted above from the upper surface of the substrate W by being moved in the vertical direction.

An organic solvent supply pipe 38, that supplies an organic solvent (IPA in this preferred embodiment) as a low surface tension liquid to the organic solvent nozzle 13, is coupled to the organic solvent nozzle 13. An organic solvent valve 39 is interposed in the organic solvent supply pipe 38 to open and close its flow path. A third inert gas supply pipe 40 that supplies an inert gas such as nitrogen gas to the drying head 14 is coupled to the drying head 14. A third inert gas valve 41 is interposed in the third inert gas supply pipe 40 to open and close its flow path. An exhaust pipe 42 that exhausts the inside and surroundings of the drying head 14 is coupled to the drying head 14. An exhaust valve 49 is interposed in the exhaust pipe 42 to open and close its flow path.

Figure 3A:
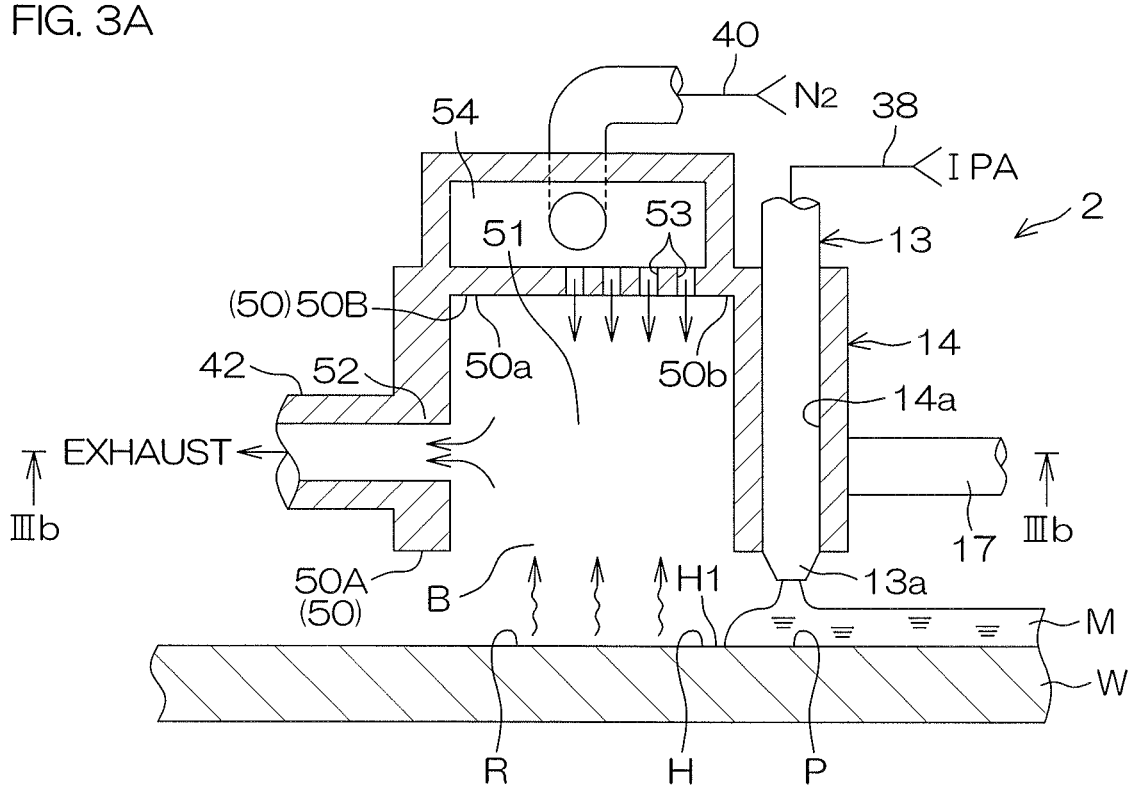
FIG. 3A is a schematic longitudinal sectional view of a drying head provided for the processing unit.
Figure 3B:
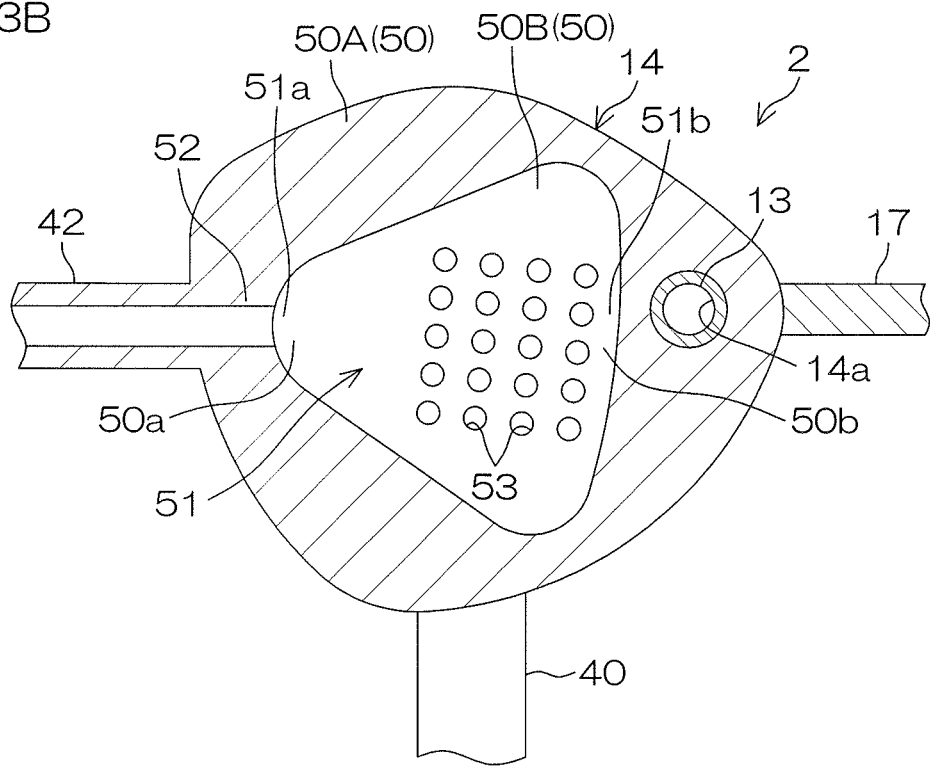
FIG. 3B is a transverse sectional view taken along line IIIb-IIIb in FIG. 3A.

FIG. 3A is a schematic longitudinal sectional view of the drying head 14. FIG. 3B is a transverse sectional view taken along line IIIb-IIIb in FIG. 3A.

The drying head 14 has, for example, a block-shaped form. The drying head 14 has a longitudinal direction in the horizontal direction, and is about 90 mm in size in the longitudinal direction. The drying head 14 has an facing surface 50 having a smaller planar view size than the substrate W. The facing surface 50 is recessed upward from the upper surface of the substrate W to define an inert gas retaining space 51 in the drying head 14. The facing surface 50 includes a first surface 50A defined by the lower surface of the drying head 14 and a second surface 50B defined by the ceiling surface of the inert gas retaining space 51.

The drying head 14 includes an exhaust port 52 that exhausts the inert gas retaining space 51, a plurality of inert gas introduction ports 53 formed in the ceiling surface of the inert gas retaining space 51, and an inert gas supply chamber 54 demarcated on the opposite side of the plurality of inert gas introduction ports 53 to the inert gas retaining space 51.

The exhaust pipe 42 described above is coupled to the exhaust port 52. Gases such as an organic solvent gas and an inert gas exhausted from the exhaust port 52 are sent outside the drying head 14 via the exhaust pipe 42. The third inert gas supply pipe 40 described above is coupled to the inert gas supply chamber 54.

The inert gas supplied from the third inert gas supply pipe 40 to the inert gas supply chamber 54 is diffused in the inert gas supply chamber 54 and is supplied from the plurality of inert gas introduction ports 53 to the inert gas retaining space 51 at a uniform flow rate. In this preferred embodiment, the concentration of the organic solvent gas in the space between the facing surface 50 and the upper surface of the substrate W is reduced by exhausting the inert gas retaining space 51 via the exhaust port 52 and supplying the inert gas to the inert gas retaining space 51. Thereby, in the space between the facing surface 50 and the upper surface of the substrate W, a low-humidity space B which has a lower humidity than the outside of the space is formed. The low-humidity space B promotes the evaporation of the organic solvent on the upper surface of the substrate W, and which allows efficiently drying of the organic solvent on the upper surface of the substrate W.

As described above, the drying head 14 is an example of a drying head that dries the upper surface of the substrate W. Accordingly, the moving unit 15 functions as a drying head moving unit that moves the drying head 14 along the upper surface of the substrate W.

The second surface 50B of the facing surface 50 has a nearly sectorial planar shape. More specifically, the sectorial shape defined by the second surface 50B of the facing surface 50 has a pivot point 50a disposed at a position far from the through hole 14a through which the organic solvent nozzle 13 extends. The sectorial shape defined by the second surface 50B of the facing surface 50 has an arc 50b disposed at a position closer to the through hole 14a than the pivot point 50a.

The inert gas retaining space 51 has a substantially sectorial planar shape. A portion 51a forming the pivot point of the sectorial shape communicates with the exhaust port 52. A portion 51b forming the arc of the sectorial shape is located closer to the exhaust port 52 than the organic solvent nozzle 13. Disposing the portion 51a forming the pivot point of the sectorial shape of the inert gas retaining space 51 at a position near the exhaust port 52 can guide an organic solvent steam in the inert gas retaining space 51 to the exhaust port 52 upon gathering the steam. Thereby, it is possible to efficiently exhaust the inert gas retaining space 51.

Figure 4:
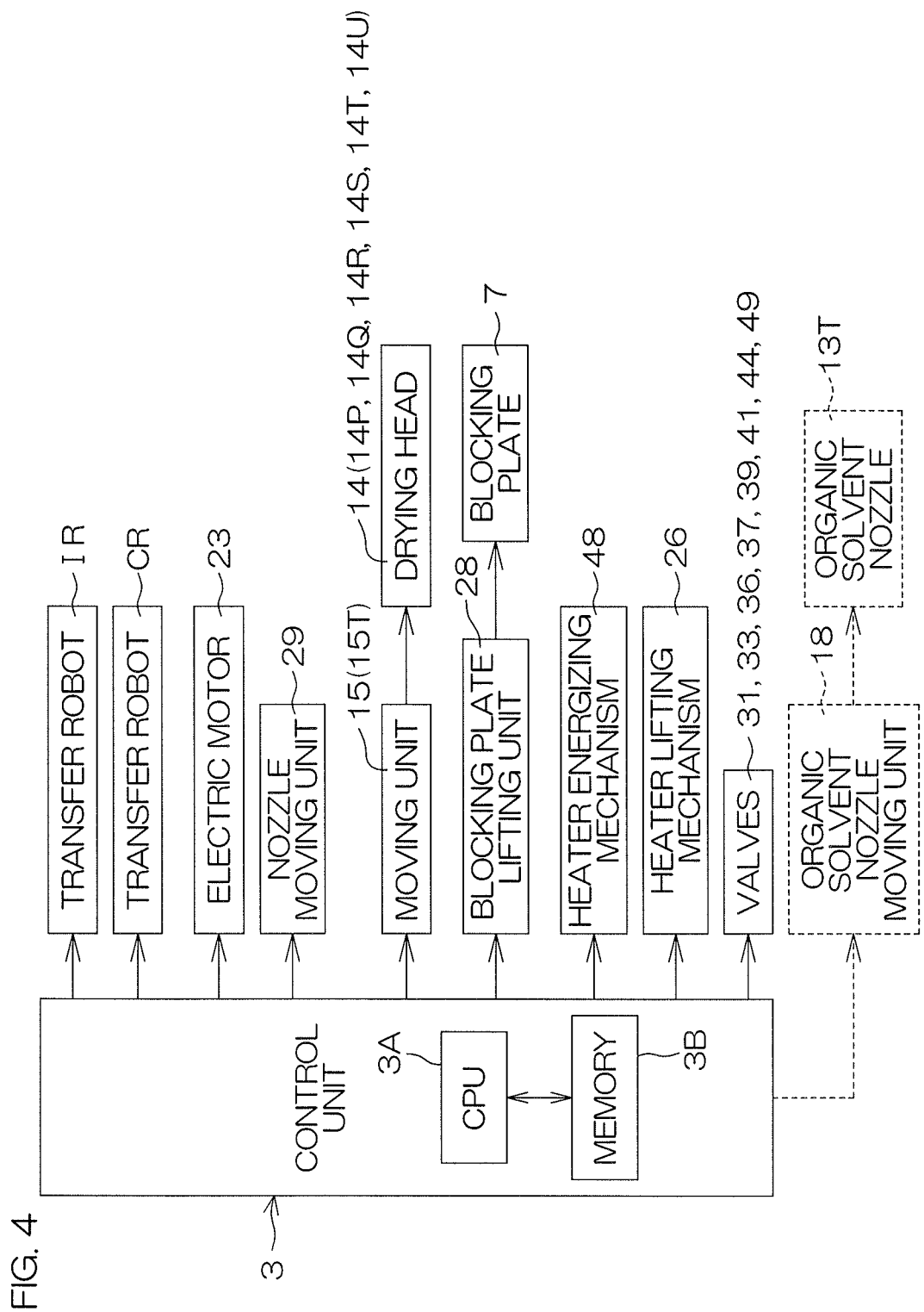
FIG. 4 is a block diagram for explaining the electrical configuration of the main part of the substrate processing apparatus.

FIG. 4 is a block diagram for explaining the electrical configuration of the main part of the substrate processing apparatus 1. The controller 3 includes a microcomputer, and controls control targets provided in the substrate processing apparatus 1 in accordance with predetermined control programs. More specifically, the controller 3 includes a processor (CPU) 3A and a memory 3B storing control programs, and is configured to execute various types of control operations for substrate processing by causing the processor 3A to execute control programs. In particular, the controller 3 controls the operations of the transfer robots IR and CR, the electric motor 23, the nozzle moving unit 29, the moving unit 15, the blocking plate lifting unit 28, the heater energizing mechanism 48, the heater lifting mechanism 26, the valves 31, 33, 36, 37, 39, 41, 44, and 49, and the like. The controller 3 controls the drying head 14 by controlling the third inert gas valve 41 and the exhaust valve 49.

FIG. 5 is a flowchart for explaining an example of substrate processing by the substrate processing apparatus 1, mainly showing processing executed by causing the controller 3 to execute operation programs. The unprocessed substrate W is loaded from the carrier C into the processing unit 2 by the transfer robots IR and CR, and is transferred to the spin chuck 5 (step S1). Thereafter, the substrate W is horizontally held by the spin chuck 5 until being unloaded by the transfer robot CR (a substrate holding step).

After the transfer robot CR retracts to the outside of the processing unit 2, a chemical liquid processing (step S2) is started. In the chemical liquid processing step, first, the supply of an inert gas is started. Specifically, the controller 3 opens the first inert gas valve 44 to supply an inert gas from the inert gas nozzle 11 toward the upper surface of the substrate W. At this time, the flow rate of inert gas is low flow rate. The low flow rate is, for example, a flow rate which is less than 3 L/min.

The controller 3 drives the electric motor 23 to rotate the spin base 21 at a predetermined chemical liquid rotational speed. The controller 3 controls the blocking plate lifting unit 28 to position the blocking plate 7 at the upper position. Meanwhile, the controller 3 controls the nozzle moving unit 29 to dispose the moving nozzle 12 at a chemical liquid processing position above the substrate W. The chemical liquid processing position may be a position at which the chemical liquid discharged from the moving nozzle 12 is landed on the rotation center of the upper surface of the substrate W. The controller 3 then opens the chemical liquid valve 36. Thereby, the chemical liquid is supplied from the moving nozzle 12 toward the upper surface of the substrate W in a rotated state. The supplied chemical liquid spreads over the entire upper surface of the substrate W by centrifugal force.

After the chemical liquid processing is performed for a predetermined time, by replacing the chemical liquid on the substrate W with DIW, a DIW rinse processing (step S3) for removing the chemical liquid from the upper surface of the substrate is executed W. Specifically, the controller 3 closes the chemical liquid valve 36 and opens the DIW valve 33 instead. Thereby, DIW is supplied from the DIW nozzle 10 toward the upper surface of the substrate W in a rotated state. The supplied DIW spreads over the entire upper surface of the substrate W by centrifugal force. The chemical liquid on the substrate W is washed away with this DIW. During this period, the controller 3 controls the nozzle moving unit 29 to retract the moving nozzle 12 from above the substrate W to a side of the cup 8.

In the DIW rinse processing as well, the supply of the inert gas by the inert gas nozzle 11, and the rotation of the substrate W by the spin base 21 are continued. In the DIW rinse processing as well, the inert gas is supplied at the low flow rate. The substrate W is rotated at a predetermined DIW rinse rotational speed.

After the DIW rinse processing is performed for a predetermined period of time, an organic solvent processing (step S4), for replacing the DIW on the substrate W with an organic solvent (for example, IPA) as a low surface tension liquid having a lower surface tension than water, is executed.

While the organic solvent processing is executed, the substrate W may be heated. Specifically, the controller 3 controls the heater lifting mechanism 26 to position the heater mechanism 6 at the upper position. The controller 3 then controls the heater energizing mechanism 48 to energize the heater mechanism 6. Thereby, the substrate W is heated. The substrate W need not always be heated by the heater mechanism 6. That is, the controller 3 may open the heated fluid valve 31 to supply a heated fluid from the lower surface nozzle 9, thereby causing the substrate W to be heated.

The controller 3 controls the moving unit 15 to move the organic solvent nozzle 13 to an organic solvent rinse position above the substrate W. The organic solvent rinse position may be a position at which the organic solvent (for example, IPA) discharged from the discharge port 13a of the organic solvent nozzle 13 is landed on the rotation center of the upper surface of the substrate W.

The controller 3 then controls the blocking plate lifting unit 28 to position the blocking plate 7 at a processing position between the upper position and the lower position. The processing position is a position at which the organic solvent nozzle 13 and the drying head 14 can horizontally move between the blocking plate 7 and the substrate W. The controller 3 then closes the DIW valve 33 and opens the organic solvent valve 39. Thereby, an organic solvent is supplied from the organic solvent nozzle 13 toward the upper surface of the substrate W in a rotated state. The supplied organic solvent spreads over the entire upper surface of the substrate W by centrifugal force to replace the DIW on the substrate W. After replacing the DIW with the organic solvent, a water repellent agent is supplied onto the upper surface of the substrate W by using another nozzle (not shown) that supplies the water repellent agent to the substrate W to replace the organic solvent with the water repellent agent, and thereafter, the water repellent agent may be placed with the organic solvent.

In the organic solvent processing, the controller 3 decelerates the rotation of the spin chuck 5, and stops supplying the organic solvent. Thereby, a liquid film of the organic solvent is formed on the substrate W (a liquid film forming step).

When removing the organic solvent liquid film, the controller 3 controls the first inert gas valve 44 to spray an inert gas from the inert gas nozzle 11 toward a central region of the substrate W (an inert gas spraying step).

Thereby, the organic solvent liquid film is removed by the inert gas at the position at which the inert gas is sprayed, that is, at the central region of the substrate W. Thereby, an opening is formed in a central region of the organic solvent liquid film so as to expose the front surface of the substrate W (an opening forming step). Therefore, the inert gas nozzle 11 is included in an inert gas supply unit that sprays an inert gas toward a central region of the organic solvent liquid film. The inert gas nozzle 11 is also included in an opening forming unit that forms an opening in the central region of the organic solvent liquid film. The central region of the organic solvent liquid film is a region overlapping the central region of the upper surface of the substrate W in a plan view. The organic solvent on the substrate W is removed to the outside of the substrate W by expanding this opening (a liquid film removing step). The controller 3 controls the electric motor 23 to rotate the substrate W in parallel with the liquid film removing step (a substrate rotating step). The inert gas spraying step is continued until the completion of the liquid film removing step.

The opening is expanded by the force added to the organic solvent liquid film by spraying of the inert gas and the centrifugal force generated by the rotation of the substrate W. The organic solvent liquid film is removed from the upper surface of the substrate W, due to expanding the opening. As the opening expands, the controller 3 controls the moving unit 15 to move the organic solvent nozzle 13 and the drying head 14 toward the peripheral edge of the substrate W. At this time, the controller 3 opens the organic solvent valve 39 to supply an organic solvent from the organic solvent nozzle 13 to the organic solvent liquid film, and opens the third inert gas valve 41 to supply an inert gas to the upper surface of the substrate W, which has been exposed by the removal of the organic solvent liquid film, thereby drying the upper surface of the substrate W. The controller 3 also opens the exhaust valve 49 to exhaust the inert gas retaining space 51.

After completion of the organic solvent processing, the controller 3 closes the organic solvent valve 39, the third inert gas valve 41, and the exhaust valve 49. Thereafter, the controller 3 controls the moving unit 15 to retract the organic solvent nozzle 13 and the drying head 14 to the home positions. The controller 3 also closes the first inert gas valve 44 to stop supplying the inert gas from the inert gas nozzle 11. The controller 3 then controls the electric motor 23 to rapidly rotate the substrate W at a drying rotational speed. Thereby, the controller 3 performs drying processing (step S5: a spin-drying) for scattering liquid components away from the substrate W by centrifugal force.

In spin-drying, the controller 3 controls the electric motor 23 to rapidly rotate the substrate W at a predetermined drying rotational speed. The drying rotational speed is, for example, 800 rpm. Thereby, the liquid components are scattered away from the substrate W by centrifugal force. Spin-drying is performed in a state in which the controller 3 has moved the blocking plate 7 to the lower position by controlling the blocking plate lifting unit 28.

Subsequently, the controller 3 controls the electric motor 23 to stop rotating the spin chuck 5. The controller 3 then controls the blocking plate lifting unit 28 to retract the blocking plate 7 to the upper position. The controller 3 then closes the first inert gas valve 44 to stop supplying the inert gas from the inert gas nozzle 11.

Subsequently, the transfer robot CR enters the processing unit 2 to pick up the processed substrate W from the spin chuck 5 and unload the substrate W outside the processing unit 2 (step S6). The substrate W is transferred from the transfer robot CR to the transfer robot IR and is accommodated in the carrier C by the transfer robot IR.

FIG. 6 is a timing chart for explaining the details of organic solvent processing (step S4 in FIG. 5). FIGS. 7A to 7D each are an illustrative sectional view of the main part of the processing unit 2 to explain the state of organic solvent processing (step S4 FIG. 5).

The organic solvent processing includes an organic solvent rinse step T1, a liquid film forming step T2, a hole forming step T3, and a hole expanding step T4. These steps are executed in the order named. Referring to FIG. 6, "IPA nozzle position" indicates the position of the organic solvent nozzle 13, and "IPA discharge" indicates the discharge state of an organic solvent from the organic solvent nozzle 13.

Figure 7A:
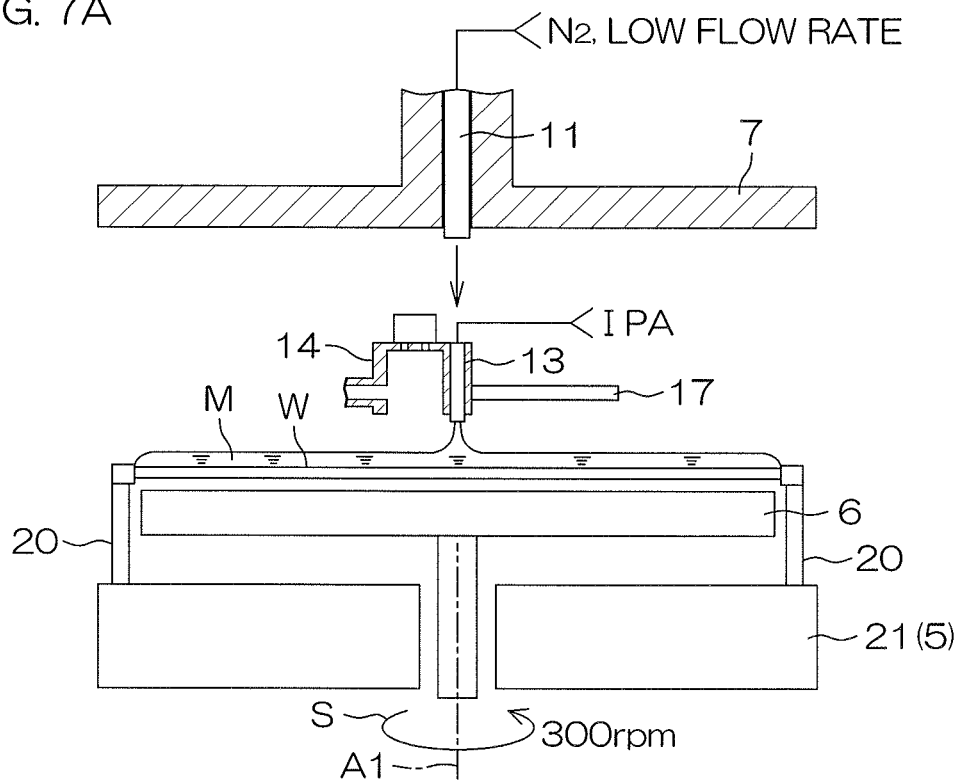
FIG. 7A is an illustrative sectional view for explaining a state of organic solvent processing (step S4 in FIG. 5).
Figure 7B:
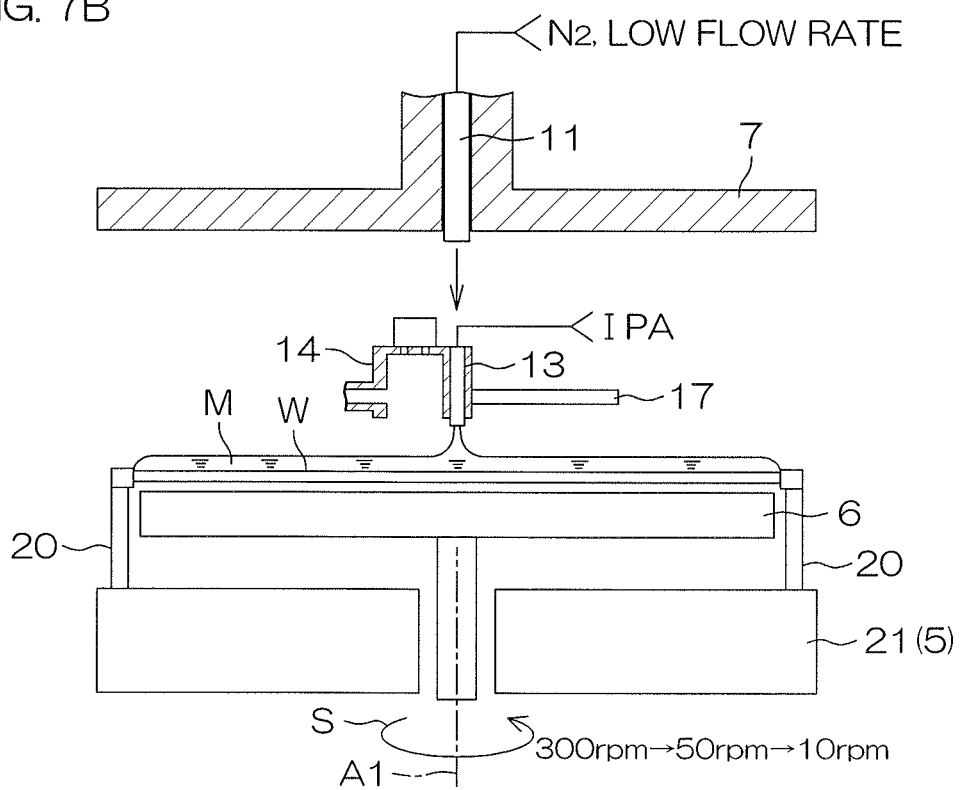
FIG. 7B is an illustrative sectional view for explaining a state of organic solvent processing (step S4 in FIG. 5).

The organic solvent rinse step T1 is a step (the low surface tension liquid supply step and the liquid film forming step) of supplying an organic solvent as a low surface tension liquid onto the upper surface of the substrate W, while rotating the substrate W. As shown in FIG. 7A, an organic solvent (for example, IPA) is supplied from the organic solvent nozzle 13 onto the upper surface of the substrate W. The supplied organic solvent receives a centrifugal force to move from the central region of the upper surface of the substrate W to the peripheral edge. Accordingly, all the DIW (rinse liquid) supplied onto the upper surface of the substrate W in the DIW rinse processing (step S3 in FIG. 5) is replaced with the organic solvent.

In the organic solvent rinse step T1, the controller 3 controls the blocking plate lifting unit 28 to position the blocking plate 7 at the processing position. The upper surface of the substrate W is covered by the blocking plate 7 located at the processing position. Accordingly, the space between the blocking plate 7 and the upper surface of the substrate W is blocked from the outside space. Therefore, it is possible to suppress or prevent liquid droplets bounced from a wall surface of the processing unit 2, mist in the atmosphere, or the like from adhering to the upper surface of the substrate W.

In the organic solvent rinse step T1, the inert gas is also continued to be supplied from the inert gas nozzle 11 at a low flow rate.

During the period of the organic solvent rinse step T1, the spin chuck 5 rotates the substrate W at a predetermined organic solvent rinse processing speed. The organic solvent rinse processing speed is, for example, 300 rpm. The organic solvent nozzle 13 is disposed at a central position. The central position is a position at which the organic solvent nozzle 13 faces the substrate W from above on the rotation axis A1 of the substrate W. The organic solvent valve 39 is set in the open state. Accordingly, an organic solvent (for example, IPA) is supplied from above toward the rotation center of the upper surface of the substrate W. The moving nozzle 12 is retracted at the home position on a side of the cup 8. The chemical liquid valve 36 and the second inert gas valve 37 are controlled to be set in the closed state.

The liquid film forming step T2 is a step of increasing the thickness of a liquid film M of the organic solvent by decelerating the rotation of the substrate W and reducing the amount of organic solvent scattered from the substrate W. In liquid film forming step T2, the thick liquid film M (for example, having a film thickness of 1 mm) is formed on the front surface of the substrate W.

The rotation of the substrate W is continuously decelerated stepwise from the organic solvent rinse processing speed. More specifically, the rotational speed of the substrate W is decelerated from 300 rpm to 50 rpm and is maintained for a predetermined period of time (for example, 10 sec). Thereafter, the rotation speed is decelerated to 10 rpm and maintained for a predetermined period of time (for example, 30 sec). In the liquid film forming step T2, conditions other than "substrate rotational speed" in FIG. 6 are maintained the same as in organic solvent rinse step T1. The organic solvent nozzle 13 is held at the central position, and continues to supply an organic solvent toward the rotation center of the upper surface of the substrate W. As the supply of an organic solvent from the organic solvent nozzle 13 is continued until the completion of liquid film forming step T2, it is prevented that the organic solvent is lost on any part of the upper surface of the substrate W.

Figure 7C:
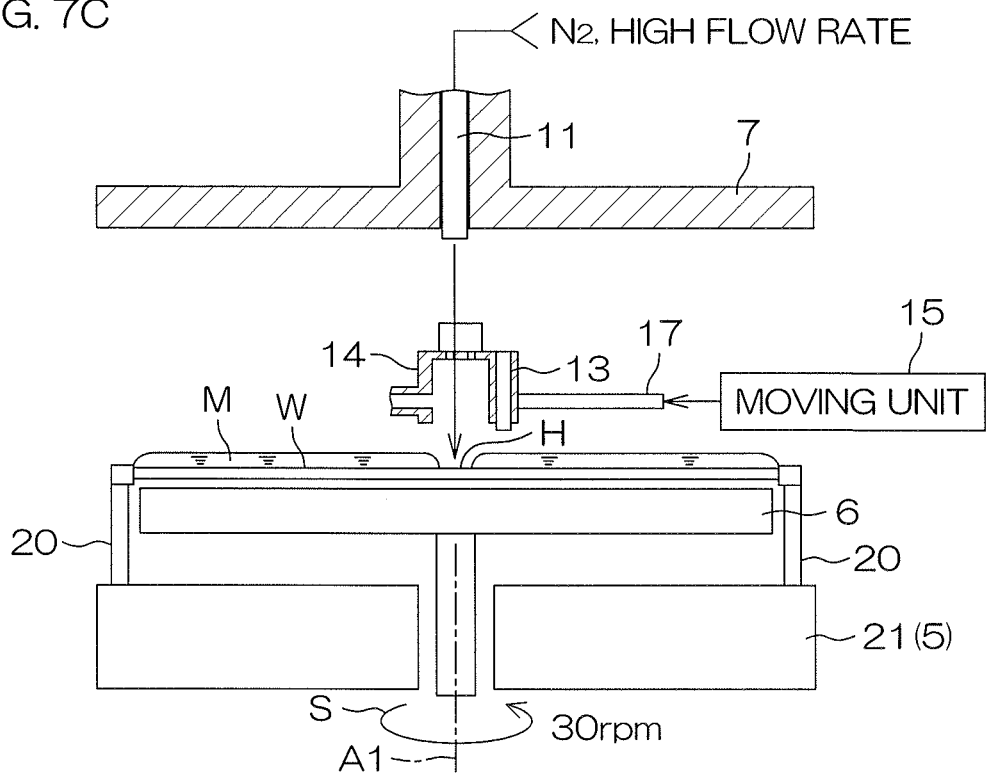
FIG. 7C is an illustrative sectional view for explaining a state of organic solvent processing (step S4 in FIG. 5).
Figure 7D:
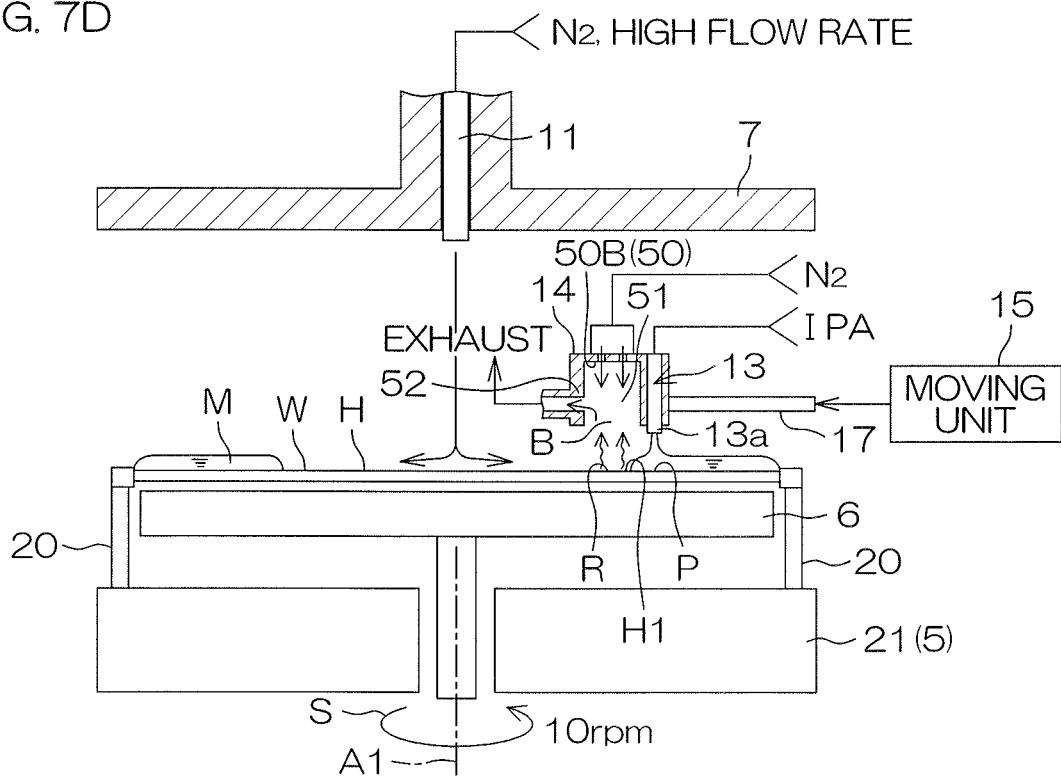
FIG. 7D is an illustrative sectional view for explaining a state of organic solvent processing (step S4 in FIG. 5).

As shown in FIG. 7C, the hole forming step T3 is a step (the opening forming step) of exposing the central region of the upper surface of the substrate W by forming a small opening H (for example, having a dimeter of about 30 mm) in a central region of the liquid film M. In hole forming step T3, an inert gas (for example, nitrogen gas) is vertically sprayed from the inert gas nozzle 11 toward the central region of the liquid film M at a high flow rate (for example, 3 L/min) to form the opening H in the liquid film M (the inert gas spraying step).

In the hole forming step T3, the inert gas spraying step need not always be performed. For example, the opening H may be formed in the central region of the liquid film M by evaporating the organic solvent in the central region by heating the substrate W (the opening forming step). The controller 3 opens the heated fluid valve 31 to supply a heated fluid from the lower surface nozzle 9 to a central region of the lower surface of the substrate W, thereby heating the substrate W. At this time, no inert gas may be sprayed on the substrate W. Therefore, the lower surface nozzle 9 can function as an opening forming unit that forms the opening H in the central region of the liquid film M. In addition, the opening H may be formed in the liquid film M by both spraying an inert gas on the upper surface of the substrate W and heating the central region of the lower surface of the substrate W by using a heated fluid.

During the period of the hole forming step T3, the controller 3 controls the organic solvent valve 39 to stop supplying an organic solvent from the organic solvent nozzle 13. During the period of the hole forming step T3, the blocking plate 7 is maintained at the processing position.

During the period of the hole forming step T3, the controller 3 controls the moving unit 15 to move the organic solvent nozzle 13 and the drying head 14 to a hole forming position. The hole forming position is a position slightly shifted from the central region of the substrate W to the peripheral edge of the substrate W. By positioning the organic solvent nozzle 13 and the drying head 14 at the hole forming position, the inert gas nozzle 11 can supply an inert gas to the central region of the liquid film M without interference from the organic solvent nozzle 13 and the drying head 14. Referring to FIG. 7C, the drying head 14 is located below the inert gas nozzle 11, but, in practice, the hole forming position is a position to avoid the central region of the upper surface of the substrate W to which an inert gas is sprayed from the inert gas nozzle 11.

In the hole forming step T3, the controller 3 controls the electric motor 23 to gradually accelerate the rotation of the spin base 21. Specifically, the rotation of the spin base 21 is accelerated up to a predetermined opening forming speed. The opening forming speed is, for example, 30 rpm. The opening forming speed is not limited to 30 rpm and can be changed within a range of 10 rpm to 50 rpm.

The hole expanding step T4 is a step (the liquid film removing step and the substrate rotating step) of removing the liquid film M from the upper surfaced of the substrate W by expanding the opening H in the liquid film M by rotating the substrate W. In the hole expanding step T4, the substrate rotating step and the liquid film removing step are concurrently executed. That is, the rotation of the substrate W is maintained until the removal of the liquid film M from the upper surface of the substrate W.

In the hole expanding step T4, the controller 3 controls the electric motor 23 to gradually decelerate the rotation of the spin base 21 up to a predetermined liquid film removing speed (a rotation decelerating step). The liquid film removing speed is, for example, 10 rpm. The liquid film removing speed is not limited to 10 rpm and can be changed within a range of 10 rpm to 30 rpm.

In the hole expanding step T4, the controller 3 maintains spraying an inert gas from the inert gas nozzle 11 to the central region of the substrate W (the inert gas spraying step). Spraying of the inert gas by the inert gas nozzle 11 is continued until the removal of the liquid film M from the upper surface of the substrate W, that is, until the completion of the liquid film removing step.

In the hole expanding step T4, the controller 3 controls the organic solvent valve 39 to resume supplying the organic solvent from the organic solvent nozzle 13 onto the upper surface of the substrate W. The temperature (organic solvent temperature) of the organic solvent supplied from the organic solvent nozzle 13 is preferably higher than room temperature, for example, 50° C. In this case, the controller 3 sets a liquid landing point P of the organic solvent supplied from the organic solvent nozzle 13 outside the opening H. The liquid landing point P is a point at which the organic solvent supplied from the organic solvent nozzle 13 is landed on the supper surface of the substrate W. Because the organic solvent nozzle 13 does not rotate around the rotation axis A1, the liquid landing point P relatively moves to the upstream side in a substrate rotating direction S as the substrate W rotates. The outside of the opening H is the opposite side of a peripheral edge H1 of the opening H to the rotation axis A1.

In the hole expanding step T4, the controller 3 opens the first inert gas valve 44 to start supplying an inert gas from the drying head 14 to the substrate W. The temperature (inert gas temperature) of the inert gas supplied from the drying head 14 is preferably higher than room temperature, for example, 50° C. At the same time, the controller 3 opens the exhaust valve 49 to exhaust the inert gas and organic solvent steam retained in the inert gas retaining space 51 from the exhaust port 52.

In the hole expanding step T4, the controller 3 sets a dry region R inside the opening H. The dry region R is a region, in which the upper surface of the substrate W is to be dried inside the opening H. Specifically, the dry region R is a region on the upper surface of the substrate W which faces the facing surface 50 of the drying head 14. That is, when the drying head 14 is located inside the outer periphery of the substrate W in a plan view, the facing surface 50 of the drying head 14 faces the dry region R. The dry region R overlaps the second surface 50B of the facing surface 50 of the drying head 14 in a plan view. Because the drying head 14 does not rotate around the rotation axis A1, the dry region R relatively moves to the upstream side in the substrate rotating direction S as the substrate W rotates. The inside of the opening H is a side closer to the rotation axis A1 than the peripheral edge H1 of the opening H.

By regulating the supply flow rate of the inert gas from the inert gas introduction ports 53 and the exhaust flow rate of a gas from the exhaust port 52, various elements (for example, the concentration of an organic solvent gas in the atmosphere) of the atmosphere in the inert gas retaining space 51 are controlled. Thereby, the low-humidity space B is formed in the space between the facing surface 50 and the dry region R. Thus, by setting the humidity of the atmosphere above the dry region R to low humidity, the organic solvent remaining in the dry region R after the removal of the liquid film M can be easily evaporated. Thereby, it is possible to efficiently dry the upper surface of the substrate W.

In the hole expanding step T4, the controller 3 controls the moving unit 15 to move the organic solvent nozzle 13 in a state of discharging an organic solvent from the discharge port 13a from the hole forming position to an outer peripheral position. This moves the liquid landing point P following the expansion of the opening H (a liquid landing point moving step). The outer peripheral position is a position at which the organic solvent nozzle 13 faces the peripheral edge of the substrate W. The liquid landing point P preferably follows the expansion of the opening H near the peripheral edge H1 of the opening H.

In hole expanding step T4, the controller 3 controls the moving unit 15 to move the drying head 14 from the hole forming position to the outer peripheral position. This moves the facing surface 50 and the dry region R following the expansion of the opening H (a dry region moving step). As described above, the drying head 14 is supported by the moving member 17 commonly used for the organic solvent nozzle 13, and thereby moves following the movement of the organic solvent nozzle 13.

Figure 8A:
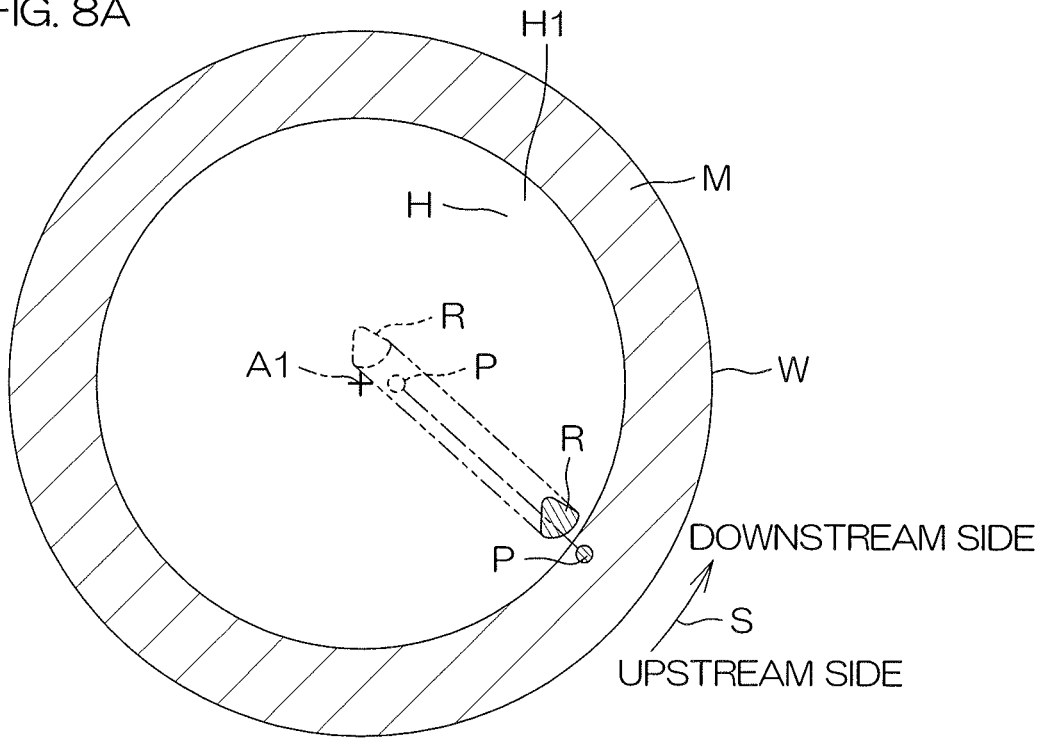
FIG. 8A is a plan view schematically showing the moving locus of a liquid landing point and a dry region in the hole expanding step shown in FIG. 7D.
Figure 8B:
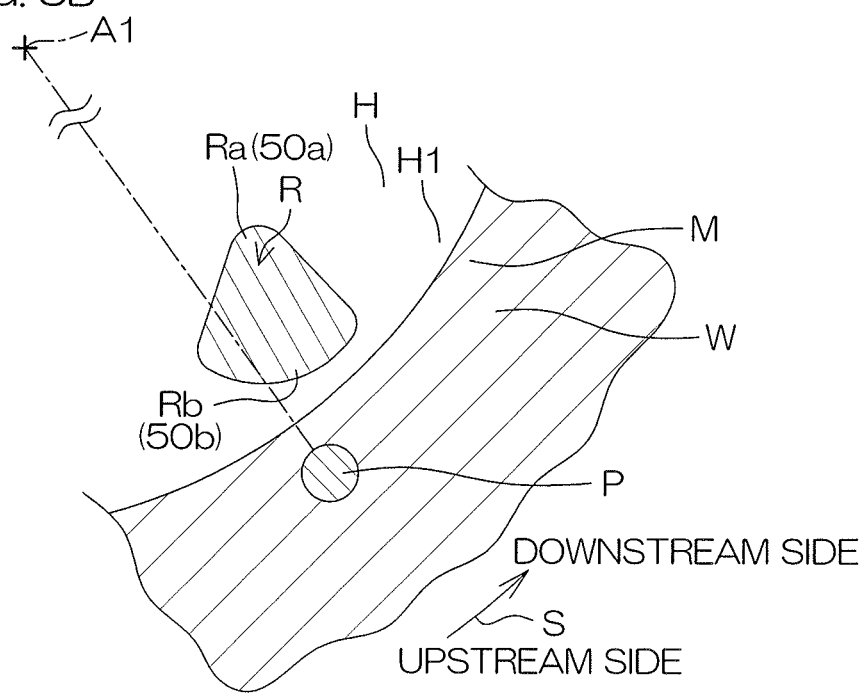
FIG. 8B is an enlarged view of a vicinity of the liquid landing point and the dry region in FIG. 8A.
Figure 15:
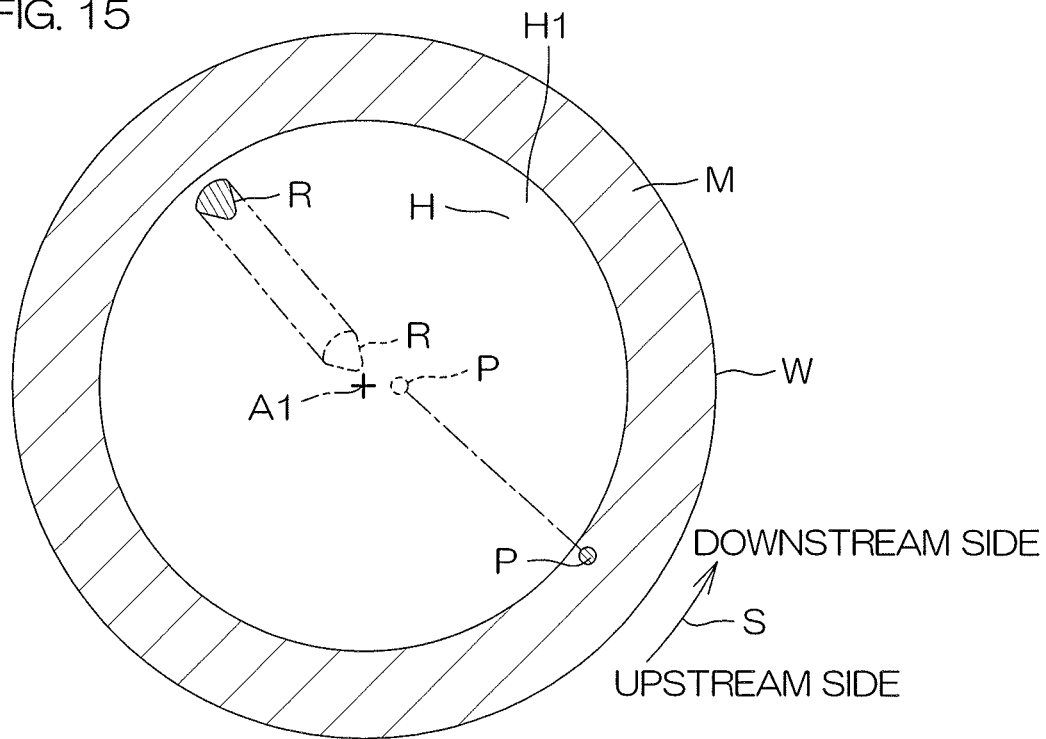
FIG. 15 is a plan view schematically showing the moving locus of a liquid landing point and a dry region in a hole expanding step according to the second preferred embodiment.

FIG. 8A is a plan view schematically showing the moving locus of the liquid landing point P and the dry region R in the hole expanding step T4. FIG. 8B is an enlarged view of the surroundings of the liquid landing point P and the dry region R in FIG. 8A. Referring to FIGS. 8A and 8B and FIG. 15 (to be described later), for the sake of clarity, the liquid film M of the organic solvent, the liquid landing point P, and the dry region R are indicated by hatching.

As shown in FIG. 8A, the dry region R moves (see the two-dotted chain line in FIG. 8A) along the moving locus (see the chain line in FIG. 8A) of the liquid landing point P so as to follow the movement of the liquid landing point P. When the drying head 14 and the organic solvent nozzle 13 are moved, the dry region R may be set such that its partial region larger than a half of the region is located downstream with respect to the liquid landing point P in the substrate rotating direction S.

Referring to FIGS. 8A and 8B, the dry region R that is a region overlapping the second surface 50B in a plan view has a nearly sectorial planar shape like the second surface 50B of the facing surface 50. The sectorial shape defined by the dry region R has a pivot point Ra located far from the liquid landing point P. The sectorial shape defined by the dry region R has an arc Rb located closer to the liquid landing point P than the pivot point Ra. The arc Rb is set such that the partial region larger than a half of the region is located upstream with respect to the pivot point Ra in the substrate rotating direction S. The arc Rb is located closer to the outside (peripheral edge side) of the substrate W than the pivot point Ra. The arc Rb is disposed along the substrate rotating direction S. Likewise, the pivot point 50a of the second surface 50B of the facing surface 50 is located far from the liquid landing point P. The arc 50b of the second surface 50B is located closer to the liquid landing point P than the pivot point Ra and located along the substrate rotating direction S. For the sake of descriptive convenience, reference numeral 50a indicating the pivot point of the second surface 50B is added to the pivot point Ra of the dry region R, and reference numeral 50b indicating the arc of the second surface 50B is added to the arc Rb of the dry region R.

According to this preferred embodiment, in the space between the facing surface 50 facing the dry region R set inside the opening H and the dry region R, the low-humidity space B having a lower humidity than the outside of the space is formed. Thereby, it is possible to quickly evaporate the organic solvent in the dry region R.

The dry region R and the facing surface 50 follow the expansion of the opening H. Thereby, it is possible to quickly evaporate the organic solvent remaining on the upper surface of the substrate W after the removal of the liquid film M of the organic solvent. In addition, because the dry region R facing the facing surface 50 is relatively large, the inert gas supplied from the drying head 14 does not locally exert a relatively large external force onto the upper surface of the substrate W.

On the other hand, the facing surface 50 has a smaller planar view size than the substrate W. Accordingly, it is possible to move the facing surface 50 while disposing the drying head 14 at a position avoiding the organic solvent nozzle 13, that is, a position sufficiently close to the upper surface of the substrate W. As a result, the organic solvent remaining in the dry region R can be evaporated more quickly.

The dry region R is set inside the opening H, and the liquid landing point P is set outside the opening H. This makes it possible to supply a sufficient amount of organic solvent to the liquid film M while restricting the natural evaporation of the organic solvent from the liquid film M until the liquid film M is removed from the upper surface of the substrate W. Accordingly, it is possible to suppress the occurrence of liquid film breaking apart caused by local evaporation of the liquid film M before the liquid film M is removed by the expansion of the opening H.

Therefore, the organic solvent can be properly removed from the upper surface of the substrate W.

The dry region R moves along the moving locus of the liquid landing point P following the movement of the liquid landing point P. Thereby, it is possible to reliably evaporate the organic solvent by using the drying head 14 before the organic solvent landed on the liquid landing point P naturally evaporates.

In the opening forming step, the inert gas nozzle 11 sprays an inert gas toward the central region of the liquid film M to efficiently and reliably form the opening H in the central region.

In addition, spraying of the inert gas is continued until the completion of a liquid film removing step. As a result, this promotes the expansion of the opening H, and the organic solvent can be can removed to the outside of the substrate W more quickly. In addition, in a liquid film removing step, because the blocking plate 7 is located at the processing position, it is possible to form an air current from the center of the substrate W to the peripheral edge of the substrate W above the substrate W. By forming such an air current, even when the organic solvent is splashed from the liquid film M by the inert gas supplied from the drying head 14, the splashed organic solvent can be prevented from falling inside the opening H.

In addition, because a substrate rotating step of rotating the substrate W is in parallel with a liquid film removing step, it is possible to promote the expansion of the opening H by using the centrifugal force generated by the rotation of the substrate W. As a result, the liquid film M can be removed to the outside of the substrate W more quickly.

As the substrate W rotates, the liquid landing point P is scanned over the substrate W outside the opening H of the liquid film M, and the dry region R is scanned over the substrate W inside the opening H. Thereby, it is possible to apply uniform drying processing to the entire upper surface of the substrate W.

At an initial stage of a liquid film removing step, because the opening H of the liquid film M is small, the dry region R is located near the central region of the upper surface of the substrate W. In contrast to this, at a final stage of the liquid film removing step, because the opening H of the liquid film M is large, the dry region R is located near the peripheral edge of the upper surface of the substrate W.

If the rotational speed of the substrate W is constant in a liquid film removing step, the distance that the dry region R relatively moves on the upper surface of the substrate W per unit time in the substrate rotating direction S at a final stage of the liquid film removing step is larger than the distance that the dry region R relatively moves on the upper surface of the substrate W per unit time in the substrate rotating direction S at an initial stage of the liquid film removing step. Accordingly, at the final stage of the liquid film removing step, the substrate upper surface drying time per unit area, that is, the time in which the drying head 14 faces the facing surface 50, is shorter than that at the initial stage of the liquid film removing step.

Gradually decelerating the rotation of the substrate W in a substrate rotating step can reduce the distance that the dry region R relatively moves per unit time in the substrate rotating direction S at the final stage of the liquid film removing step, and can prolong the substrate upper surface drying time per unit area. Thereby, it is possible to reduce the difference in substrate upper surface drying time per unit area between the initial stage and the final stage of the liquid film removing step. Accordingly, drying unevenness on the upper surface of the substrate W can be reduced.

When the drying head 14 is an inert gas supply head as in this preferred embodiment, gradually decelerating the rotation of the substrate W in a substrate rotating step can reduce the difference in time in which an inert gas is sprayed on the upper surface of the substrate W per unit area between the initial stage of the liquid film removing step and the final stage of the liquid film removing step.

The dry region R is set such that a partial region larger than a half of the region is located downstream with respect to the liquid landing point P in the substrate rotating direction S. As a result, it is possible to further reliably evaporate the organic solvent landed on the liquid landing point P before the natural evaporation of the organic solvent.

In the dry region R having the nearly sectorial planar shape, the pivot point Ra of the sectorial shape is located at a position far from the liquid landing point P, and the arc Rb of the sectorial shape is located close to the liquid landing point P and along the substrate rotating direction S. Thereby, the arc Rb of the sectorial shape is located closer to the peripheral edge side of the substrate W than the pivot point Ra, so that the difference in time in which each portion of the upper surface of the substrate W faces the facing surface 50 of the drying head 14, that is, the difference in drying time can be reduced. Accordingly, drying unevenness on the upper surface of the substrate W can be reduced In the liquid landing point moving step and the dry region moving step, the distance between the organic solvent nozzle 13 and the drying head 14 can be kept constant by moving the moving member 17 that commonly supports the organic solvent nozzle 13 and the drying head 14. Accordingly, the entire upper surface of the substrate W can be dried under uniform conditions, and therefore drying unevenness can be reduced.

Because the drying head 14 is the inert gas supply head, the humidity of the low-humidity space B can be reduced by the inert gas. Therefore, the organic solvent can be quickly evaporated from the dry region R, and therefore the upper surface of the substrate W can be quickly dried.

The facing surface 50 is recessed upward from the upper surface of the substrate W to define the inert gas retaining space 51. The inert gas supplied from the inert gas introduction ports 53 is retained in the inert gas retaining space 51. Therefore it is possible to evaporate the organic solvent remaining on the upper surface of the substrate W by using the inert gas retained in the inert gas retaining space 51. Accordingly, the organic solvent can be evaporated more quickly.

The exhaust port 52 exhausts the inert gas retaining space 51. With this operation, the organic solvent evaporated from the upper surface of the substrate W into steam is removed from the low-humidity space B via the inert gas retaining space 51. Accordingly, the low-humidity space B can be kept at a lower humidity, so that the organic solvent in the dry region R can be evaporated more quickly.

Modifications of the first preferred embodiment will be described next.

Figure 9:
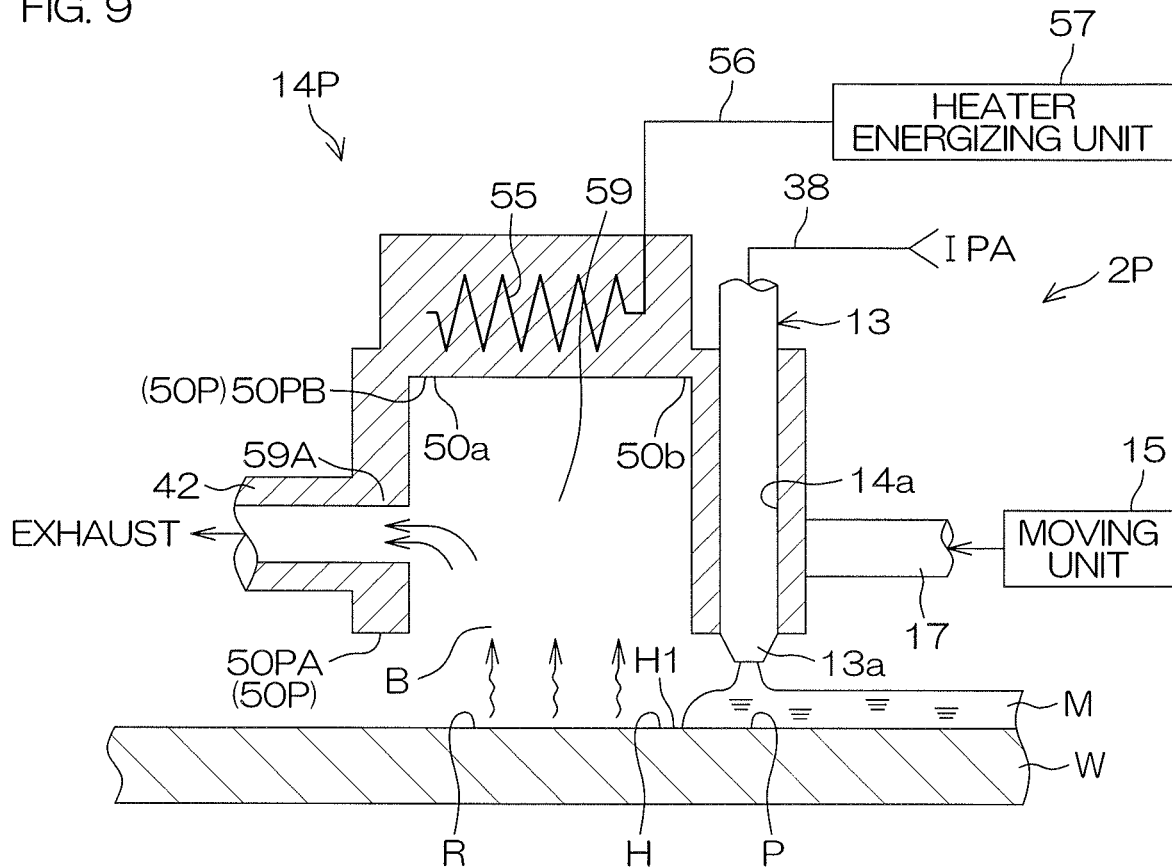
FIG. 9 is a schematic sectional view showing a drying head provided for a processing unit according to a first modification of the first preferred embodiment.

FIG. 9 is a schematic sectional view showing a drying head 14P provided for a processing unit 2P according to a first modification of the first preferred embodiment. The same reference numerals as in FIG. 9 and FIGS. 11 to 15 denote the same members as those described above, and a description of the members will be omitted.

The drying head 14P according to the first modification of the first preferred embodiment mainly differs from the drying head 14 (see FIGS. 3A and 3B) according to the first preferred embodiment in that the drying head 14P includes a heater unit 55 that heats the upper surface (dry region R) of the substrate W instead of the inert gas introduction ports 53 and the inert gas supply chamber 54.

An facing surface 50P is recessed upward from the upper surface of the substrate W to define a drying chamber 59 instead of the inert gas retaining space 51 (see FIG. 3A). The facing surface 50P includes a first surface 50PA defined by the lower surface of the drying head 14P and a second surface 50PB defined by the ceiling surface of the drying chamber 59. The second surface 50PB of the facing surface 50P may have a nearly sectorial planar shape. The sectorial shape defined by the second surface 50PB has the pivot point 50a located at a position far from the through hole 14a. The sectorial shape defined by the second surface 50PB of the facing surface 50P has the arc 50b located at a position closer to the through hole 14a than the pivot point 50a. The second surface 50PB overlaps the dry region R in a plan view. The drying head 14P includes an exhaust port 59A that exhausts the interior of the drying chamber 59. The exhaust port 59A is coupled to the exhaust pipe 42.

The heater unit 55 is disposed on, for example, the ceiling portion of the drying chamber 59. The lower surface of the heater unit 55 may define part of the second surface 50PB of the facing surface 50P. The heater unit 55 includes a resistive element that raises the temperature by being energized. Power from a heater energizing unit 57 is supplied to the heater unit 55 via a power feeder 56.

According to this arrangement, the heater unit 55 can further promote the evaporation of an organic solvent in the dry region R by heating the substrate W.

Figure 10:
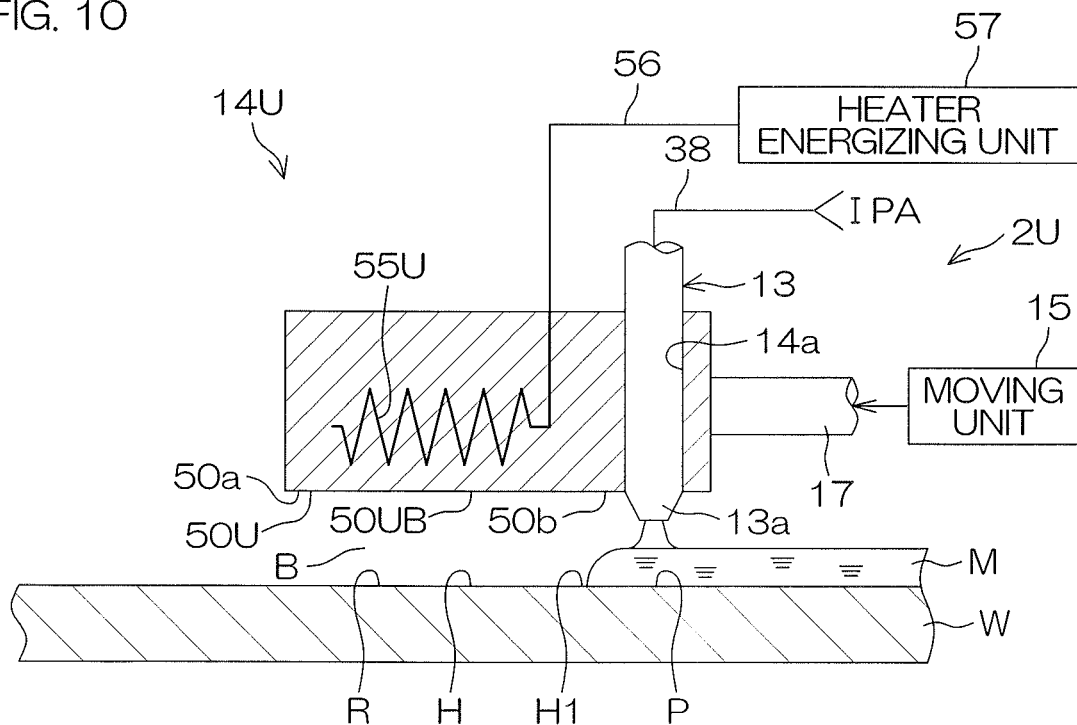
FIG. 10 is a schematic sectional view showing a drying head provided for a processing unit according to a second modification of the first preferred embodiment.

FIG. 10 is a schematic sectional view showing a drying head 14U provided for a processing unit 2U according to a second modification of the first preferred embodiment. The drying head 14U according to the second modification mainly differs from the drying head 14P according to the first modification in that an facing surface 50U of the drying head 14U is not recessed and does not form the drying chamber 59 (see FIG. 9). The facing surface 50U is defined by the lower surface of a heater unit 55U. The facing surface 50U includes a facing portion 50UB that faces the dry region R on a side closer to the heater unit 55U than the through hole 14a through which the organic solvent nozzle 13 extends.

The facing portion 50UB may have a nearly sectorial planar shape. The sectorial shape defined by the facing portion 50UB has the pivot point 50a located at a position far from the through hole 14a. The sectorial shape defined by the facing portion 50UB has an arc 50b located at a position closer to the through hole 14a than the pivot point 50a. The opposed portion 50UB overlaps the dry region R in a plan view. According to this configuration, the heater unit 55U can heat the substrate W while being located at a position closer to the upper surface of the substrate W, thereby further promoting the evaporation of the organic solvent in the dry region R.

Figure 11:
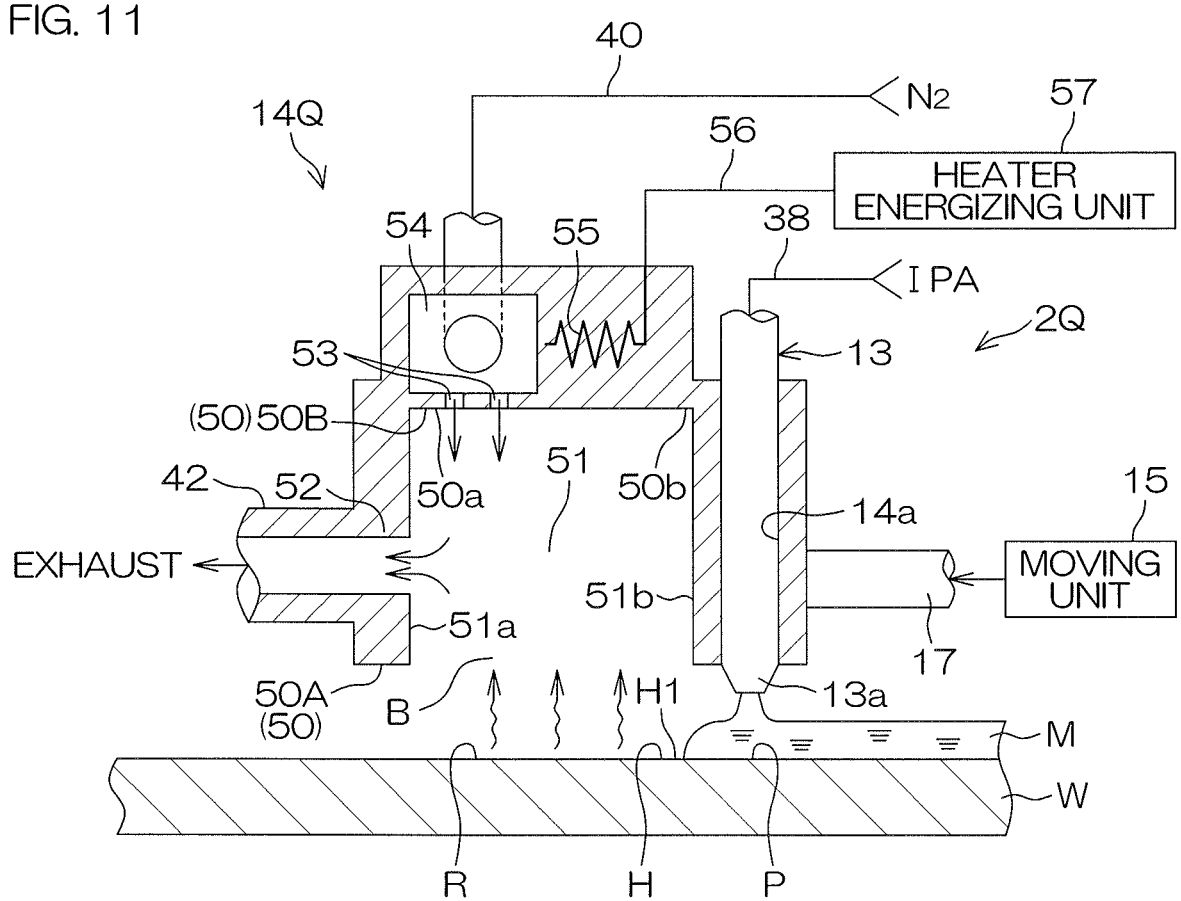
FIG. 11 is a schematic sectional view showing a drying head provided for a processing unit according to a third modification of the first preferred embodiment.

FIG. 11 is a view showing a drying head 14Q provided for a processing unit 2Q according to a third modification of the first preferred embodiment. The drying head 14Q includes the plurality of inert gas introduction ports 53 and the inert gas supply chamber 54 according to the first preferred embodiment, and also includes the heater unit 55 exemplified in the first modification. In other words, the drying head 14Q is an inert gas head having the heater unit 55. This arrangement can further promote the evaporation of an organic solvent in the dry region R by reducing the humidity of the low-humidity space B by using the inert gas in the inert gas retaining space 51 and heating by the heater unit 55.

Figure 12:
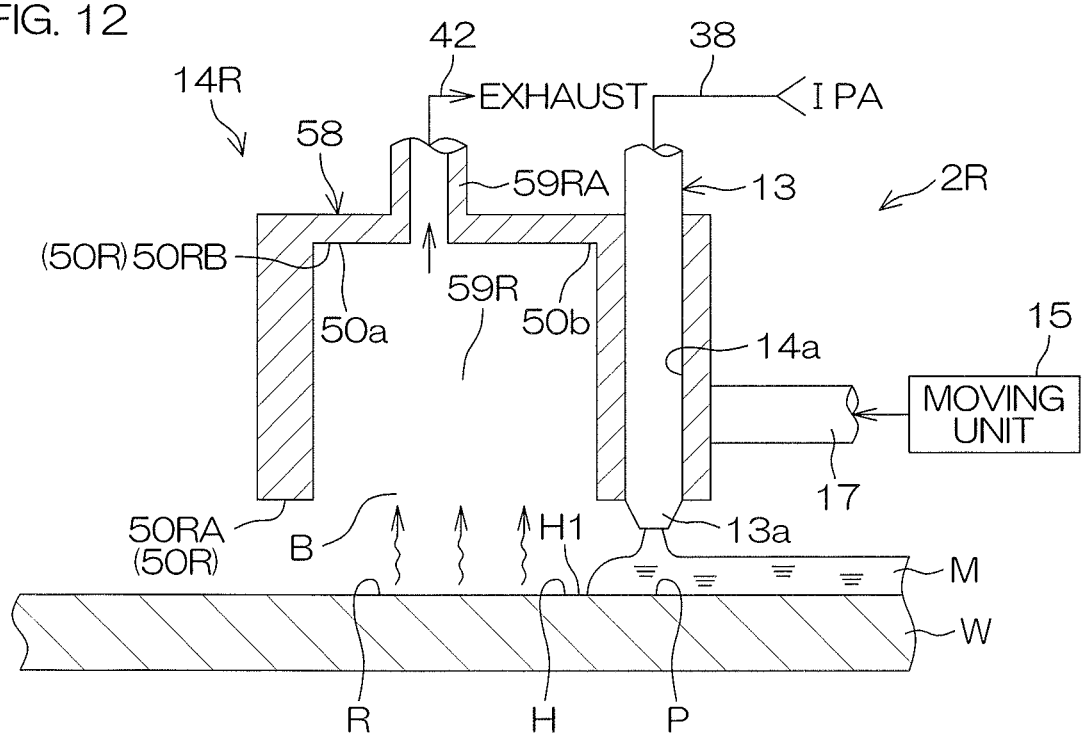
FIG. 12 is a schematic sectional view showing a drying head provided for a processing unit according to a fourth modification of the first preferred embodiment.

FIG. 12 is a schematic sectional view showing a drying head 14R provided for a processing unit 2R according to a fourth modification of the first preferred embodiment. The drying head 14R according to the fourth modification of the first preferred embodiment mainly differs from the drying head 14 (see FIGS. 3A and 3B) according to the first preferred embodiment in that the drying head 14R includes an exhaust unit 58 that exhausts the space between the facing surface 50 and the upper surface (dry region R) of the substrate W instead of the exhaust port 52, the inert gas introduction ports 53, and the inert gas supply chamber 54.

A drying chamber 59R is formed, instead of the inert gas retaining space 51 (see FIG. 3A), in the drying head 14R. The drying chamber 59R is defined by recessing a facing surface 50R upward from the upper surface of the substrate W. The facing surface 50R includes a first surface 50RA defined by the lower surface of the drying head 14R and a second surface 50RB defined by the ceiling surface of the drying chamber 59R. The second surface 50RB of the facing surface 50R may have a nearly sectorial planar shape. The sectorial shape defined by the second surface 50RB of the facing surface 50R has the pivot point 50a located at a position far from the through hole 14a. The sectorial shape defined by the second surface 50RB of the facing surface 50R has the arc 50b located at a position closer to the through hole 14a than the pivot point 50a. The second surface 50RB overlaps the dry region R in a plan view.

The drying head 14R includes an exhaust port 59RA that exhausts the interior of the drying chamber 59R. The exhaust port 59RA is formed in, for example, the second surface SORB. The exhaust port 59RA is coupled to the exhaust pipe 42. According to this configuration, the exhaust unit 58 that exhausts the space between the facing surface 50R and the dry region R can remove organic solvent steam from the low-humidity space B. Accordingly, the organic solvent in the dry region R can be evaporated more quickly.

Figure 13:
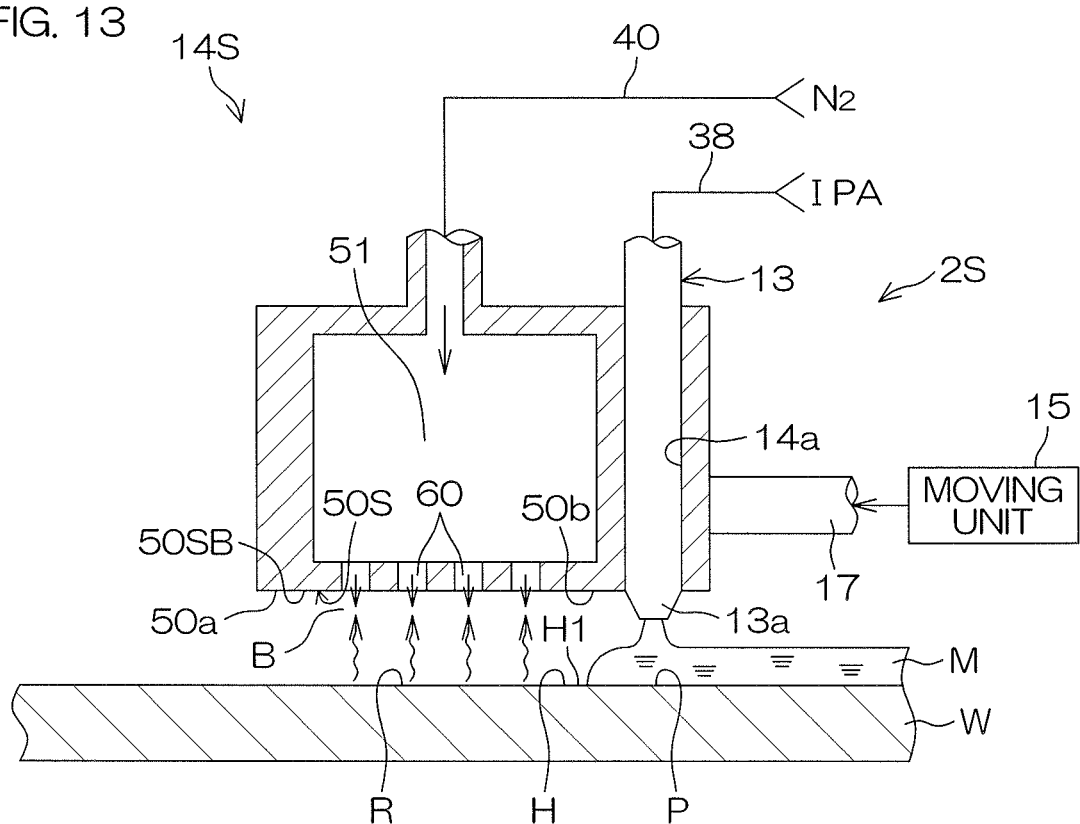
FIG. 13 is a schematic sectional view showing a drying head provided for a processing unit according to a fifth modification of the first preferred embodiment.

FIG. 13 is a schematic sectional view showing a drying head 14S provided for a processing unit 2S according to a fifth modification of the first preferred embodiment. The drying head 14S according to the fifth modification of the first preferred embodiment mainly differs from the drying head 14 (see FIGS. 3A and 3B) according to the first preferred embodiment in that an facing surface 50S is a flat surface parallel to the upper surface of the substrate W, and a plurality of inert gas discharge ports 60 are formed in the facing surface 50S.

The drying head 14S also differs from the drying head 14 according to the first preferred embodiment in that it does not include the exhaust port 52, the inert gas introduction ports 53, and the inert gas supply chamber 54, and an inert gas is directly supplied from the third inert gas supply pipe 40 to the inert gas retaining space 51.

The facing surface 50S is defined by the lower surface of the drying head 14S. The facing surface 50S includes a facing portion 50SB facing the dry region R on a side closer to an inert gas discharge port 60 than the through hole 14a through which the organic solvent nozzle 13 extends.

The facing portion 50SB may have a nearly sectorial planar shape. The sectorial shape defined by the facing portion 50SB has the pivot point 50a located at a position far from the through hole 14a. The sectorial shape defined by the facing portion 50SB has the arc 50b located at a position closer to the through hole 14a than the pivot point 50a. The facing portion 50SB overlaps the dry region R in a plan view.

According to this configuration, the plurality of inert gas discharge ports 60 are formed in the facing surface 50S that is a flat surface parallel to the upper surface of the substrate W. An inert gas is supplied from the third inert gas supply pipe 40 to the inert gas retaining space 51 communicating with the plurality of inert gas discharge ports 60. Thereby, an inert gas can be uniformly supplied over a wide range as compared with a case in which an inert gas is supplied from one discharge port, so that humidity unevenness in the low-humidity space B can be reduced. Accordingly, the organic solvent in the dry region R can be quickly evaporated, and drying unevenness on the upper surface of the substrate W can be reduced. In addition, using the plurality of inert gas discharge ports 60 can reduce the force of an inert gas supplied onto the upper surface of the substrate W. Therefore, it is possible to reduce a local external force acting on the upper surface of the substrate W.

Second Preferred Embodiment

Figure 14:
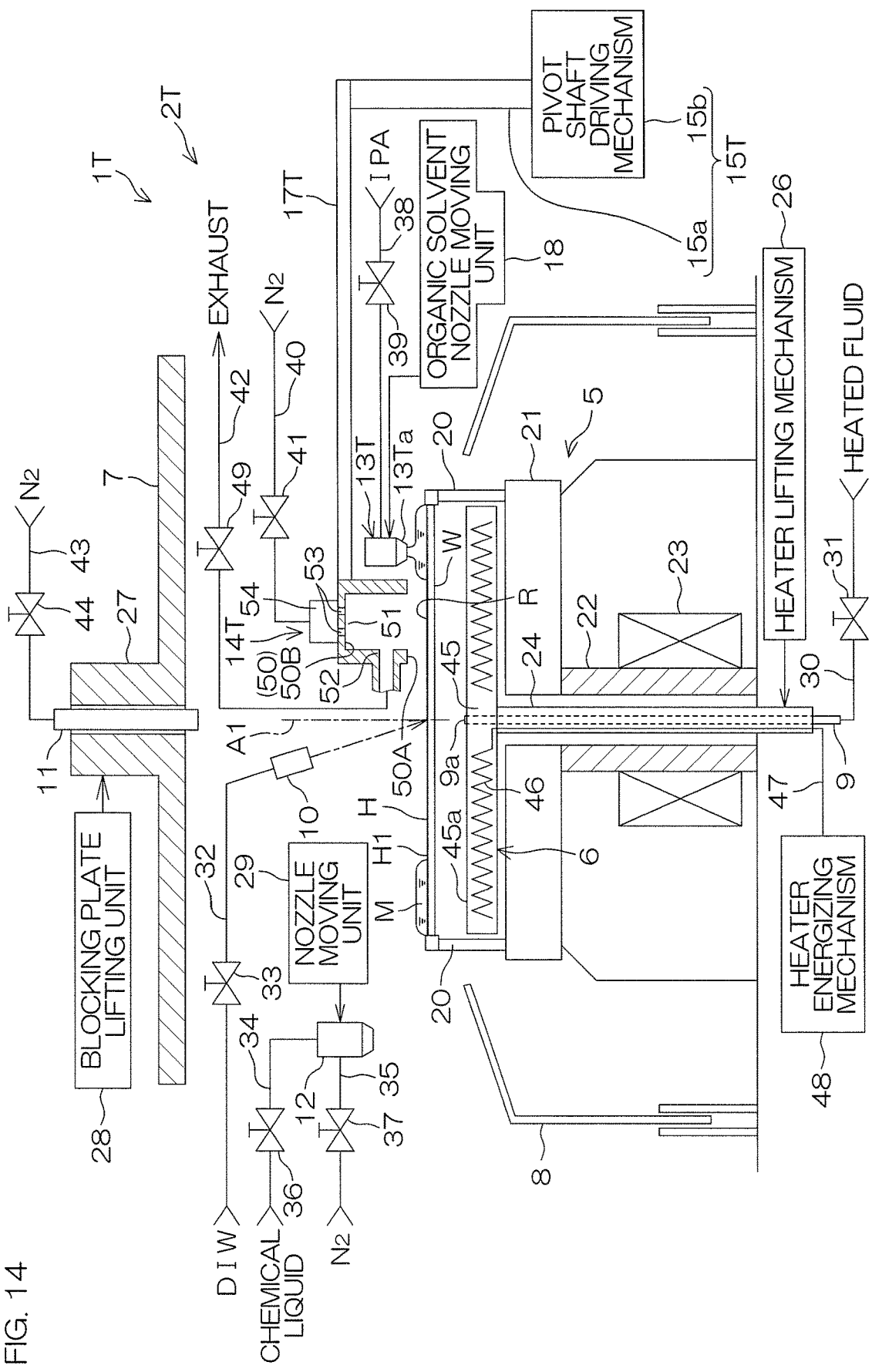
FIG. 14 is an illustrative sectional view for explaining an example of the arrangement of a processing unit provided for a substrate processing apparatus according to a second preferred embodiment of the present invention.

FIG. 14 is an illustrative sectional view for explaining an example of the arrangement of a processing unit 2T provided for a substrate processing apparatus 1T according to a second preferred embodiment of the present invention. FIG. 15 is a plan view schematically showing the moving locus of a liquid landing point P and a dry region R in the hole expanding step T4 (see FIGS. 6 and 7D). The processing unit 2T according to the second embodiment mainly differs from the processing unit 2 according to the first embodiment in that an organic solvent nozzle 13T and a drying head 14T are independently movable in the horizontal and vertical directions.

More specifically, the processing unit 2T includes a moving member 17T that supports the drying head 14T, a moving unit 15T that moves the moving member 17T, and an organic solvent nozzle moving unit 18 that supports the organic solvent nozzle 13T and moves the organic solvent nozzle 13T in the horizontal and vertical directions. The organic solvent nozzle 13T is an example of the low surface tension liquid nozzle that supplies a low surface tension liquid onto the upper surface of the substrate W. The moving unit 15T that moves the moving member 17T that supports the drying head 14T functions as a drying head moving unit that moves the drying head 14T along the upper surface of the substrate W.

The organic solvent nozzle 13T can be moved between a position to face the rotation center of the upper surface of the substrate W and a home position (retracted position) that does not face the upper surface of the substrate W by moving the organic solvent nozzle 13T in the horizontal direction by the organic solvent nozzle moving unit 18. The home position may be a position outside the spin base 21 in a plan view, and more specifically, may be located outside the cup 8. The moving nozzle 12 can be brought closer to the upper surface of the substrate W or can be retracted above from the upper surface of the substrate W by being moved in the vertical direction. The organic solvent nozzle moving unit 18 includes, for example, a pivot shaft extending along the vertical direction, an arm coupled to the pivot shaft and horizontally extending, and an arm driving mechanism that drives the arm.

The drying head 14T has the same configuration as that of the drying head 14 (see FIGS. 3A and 3B) according to the first preferred embodiment except that the through hole 14a is not provided.

The substrate processing performed by the substrate processing apparatus 1T according to the second embodiment is almost the same as the substrate processing performed by the substrate processing apparatus 1 according to the first preferred embodiment except that the controller 3 controls the moving unit 15T to move the drying head 14T, and the controller 3 controls the organic solvent nozzle moving unit 18 to move the organic solvent nozzle 13T (see FIG. 4).

The organic solvent nozzle 13T and the drying head 14T can be independently moved in the horizontal and the vertical directions, and therefore, in the hole expanding step T4 in the second preferred embodiment, unlike in the first preferred embodiment, the dry region R can be moved independently of the movement of the liquid landing point P (see FIG. 15).

That is, the controller 3 controls the organic solvent nozzle moving unit 18 to move the organic solvent nozzle 13T, in a state of discharging an organic solvent from a discharge port 13Ta, from the hole forming position to the outer peripheral position, thereby moving the liquid landing point P following the expansion of the opening H (the liquid landing point moving step). At the same time, the controller 3 controls the moving unit 15T to move the drying head 14T from the hole forming position to the outer peripheral position so as to move the facing surface 50 and the dry region R following the expansion of the opening H without following the liquid landing point P (the dry region moving step).

On the other hand, as in the hole expanding step T4 according to the first preferred embodiment, the dry region R can be moved along the moving locus of the liquid landing point P so as to follow the movement of the liquid landing point P (see FIG. 8A).

The second preferred embodiment has the same effects as those of the first preferred embodiment.

Modifications similar to those of the first preferred embodiment can be applied to the second preferred embodiment.

The present invention is not limited to the embodiments described above and can also be executed in other forms.

In the substrate processing according to the first preferred embodiment, for example, an inert gas spraying step is continued until the completion of a liquid film removing step, but it is not always necessary to continue the step. That is, after the opening H is formed in the liquid film M by causing the inert gas nozzle 11 to spray an inert gas toward the central region of the substrate W, the controller 3 may close the first inert gas valve 44 to stop supplying the inert gas from the inert gas nozzle 11.

In the substrate processing according to the first preferred embodiment, in the hole expanding step T4, the substrate W is rotated. However, the substrate W need not always be rotated. The opening H can be expanded by at least one or a combination of applying the centrifugal force generated by the rotation of the substrate W, heating the substrate by the supply of heated water from the lower surface nozzle 9, extruding the liquid film M by the supply of an inert gas from the inert gas nozzle 11, and heating the substrate W by using the heater mechanism 6.

The second surfaces 50B, 50PB, and S0RB of the facing surfaces 50, 50P, and 50R and the facing portions 50UB and 50SB need not always have sectorial planar shapes. The shapes of these surfaces can be changed as needed.

The dry region R is set such that the partial region larger than a half of the region is located downstream with respect to the liquid landing point P in the substrate rotating direction S, but this is not necessarily required, and there may be a case where the dry region R may be set such that the partial region larger than a half of the region is located upstream with respect to the liquid landing point P in the substrate rotating direction S.

The configuration of the drying head is not limited to that of the drying head 14, 14P, 14U, 14Q, 14R, 14S, or 14T. For example, the drying heads 14, 14P, and 14Q each may not include the exhaust port 52.

Although the preferred embodiments of the present invention have been described in detail above, these are merely specific examples used to clarify the technical contents of the present invention, and the present invention should not be interpreted as being limited only to these specific examples, and the scope of the present invention is limited only by the appended claims.

REFERENCE SIGNS LIST

1: Substrate processing apparatus
1T: Substrate processing apparatus
3: Control unit
9: Lower surface nozzle (opening forming unit)
11: Moving nozzle (opening forming unit, inert gas supply unit)
13: Organic solvent nozzle (low surface tension liquid nozzle, low surface tension liquid supply unit)
13T: Organic solvent nozzle (low surface tension liquid nozzle, low surface tension liquid supply unit)
14: Drying head (inert gas head)
14P: Drying head
14Q: Drying head (inert gas head)
14R: Drying head
14S: Drying head (inert gas head)
14T: drying head (inert gas head)
14U: Drying head
15: Moving unit (drying head moving unit)
15T: Moving unit (drying head moving unit)
17: Moving member
17T: Moving member
20: Chuck pin (substrate holding unit)
21: Spin base (substrate holding unit)
22: Rotating shaft (substrate rotating unit)
23: Electric motor (substrate rotating unit)
50: Facing surface
50a: Pivot point
50b: Arc
50P: Facing surface
50Q: Facing surface
50R: Facing surface
50S: Facing surface
50T: Facing surface
50U: Facing surface
51: Inert gas retaining space
52: Exhaust port
53: Inert gas introduction port
55: Heater unit
58: Exhaust unit
60: Inert gas discharge port
A1: Rotation axis B: Low-humidity space
H: Opening
M: Liquid film

What is claimed is:

1. A substrate processing apparatus comprising:
a spin chuck which holds a substrate horizontally;
a low surface tension liquid nozzle which supplies a low surface tension liquid having a lower surface tension than water onto an upper surface of the substrate held by the spin chuck;
an opening forming unit which forms an opening in a central region of a liquid film of the low surface tension liquid formed on the upper surface of the substrate held by the spin chuck;
a drying head which has a facing surface facing the upper surface of the substrate held by the spin chuck, and having a smaller planar view size than the substrate, and dries the upper surface of the substrate by forming a low-humidity space between the facing surface and the upper surface of the substrate, the low-humidity space having a humidity lower than a humidity outside the space; and
a drying head moving unit which moves the drying head along the upper surface of the substrate held by the spin chuck,
wherein the opening forming unit comprises at least one of an inert gas nozzle which sprays an inert gas to the central region of the liquid film of the low surface tension liquid, and a lower nozzle which supplies a heating fluid to a lower surface of the substrate held by the spin chuck,
the drying head moving unit comprises a pivot shaft and a motor,
the facing surface is recessed upward from the upper surface of the substrate to define a drying chamber, and
the drying head comprises a heater unit which is disposed in a ceiling portion of the drying chamber and heats the dry region.

2. The substrate processing apparatus according to claim 1, further comprising a controller which controls the low surface tension liquid nozzle, the opening forming unit, the drying head, and the drying head moving unit,
wherein the controller is programmed so as to execute a liquid film forming step of forming a liquid film of a low surface tension liquid on the upper surface of the substrate by causing the low surface tension liquid nozzle to supply a low surface tension liquid onto the upper surface of the substrate, an opening forming step of causing the opening forming unit to form an opening in a central region of the liquid film, a liquid film removing step of removing the liquid film from the upper surface of the substrate by expanding the opening, a liquid landing point moving step of setting a liquid landing point of the low surface tension liquid supplied from the low surface tension liquid nozzle outside the opening and moving the liquid landing following the expansion of the opening, and a dry region moving step of causing the facing surface of the drying head to face a dry region set inside the opening and moving the dry region and the facing surface so as to follow expansion of the opening.

3. The substrate processing apparatus according to claim 2, wherein the controller is programmed so as to execute a step of moving the dry region along a moving locus of the liquid landing point so as to follow the movement of the liquid landing point in the dry region moving step.

4. The substrate processing apparatus according to claim 2, wherein the opening forming unit comprises the inert gas supply unit, and
the controller is programmed so as to execute an inert gas spraying step of supplying an inert gas from the inert gas nozzle in the opening forming step and continue the inert gas spraying step until completion of the liquid film removing step.

5. The substrate processing apparatus according to claim 2, wherein the spin chuck rotates the substrate around a predetermined rotation axis along a vertical direction while holding the substrate,
wherein the controller is programmed so as to execute a substrate rotating step of rotating the substrate in parallel with the liquid film removing step.

6. The substrate processing apparatus according to claim 5, wherein the controller is programmed so as to execute a rotation decelerating step of decelerating rotation of the substrate in the substrate rotating step.

7. The substrate processing apparatus according to claim 5, wherein the controller is programmed so as to set the dry region such that a partial region larger than a half of the region is located downstream with respect to the liquid landing point in a substrate rotating direction.

8. The substrate processing apparatus according to claim 5, wherein the facing surface has a sectorial planar shape, a pivot point of the sectorial shape is located at a position far from the liquid landing point, and an arc of the sectorial shape is located near the liquid landing point so as to extend along a substrate rotating direction.

9. The substrate processing apparatus according to claim 1, further comprising a moving member which commonly supports the low surface tension liquid nozzle and the drying head and moves the low surface tension liquid nozzle and the drying head above the substrate, and
the drying head moving unit moves the moving member.

10. The substrate processing apparatus according to claim 1, wherein the drying head is an inert gas supply head which supplies an inert gas.

11. The substrate processing apparatus according to claim 10, wherein the inert gas supply head comprises an inert gas introduction port which supplies an inert gas to the drying chamber.

12. The substrate processing apparatus according to claim 11, wherein the inert gas supply head further comprises an exhaust port which exhausts the drying chamber.

13. The substrate processing apparatus according to claim 11, wherein the drying head further comprises an exhaust port which exhausts the drying chamber.

14. A substrate processing apparatus comprising:
a spin chuck which holds a substrate horizontally;
a low surface tension liquid nozzle which supplies a low surface tension liquid having a lower surface tension than water onto an upper surface of the substrate held by the spin chuck;
an opening forming unit which forms an opening in a central region of a liquid film of the low surface tension liquid formed on the upper surface of the substrate held by the spin chuck;
a drying head which has a facing surface facing the upper surface of the substrate held by the spin chuck, and having a smaller planar view size than the substrate, and dries the upper surface of the substrate by forming a low-humidity space between the facing surface and the upper surface of the substrate, the low-humidity space having a humidity lower than a humidity outside the space; and a drying head moving unit which moves the drying head along the upper surface of the substrate held by the spin chuck, wherein the opening forming unit comprises at least one of an inert gas nozzle which sprays an inert gas to the central region of the liquid film of the low surface tension liquid, and a lower nozzle which supplies a heating fluid to a lower surface of the substrate held by the spin chuck, the drying head moving unit comprises a pivot shaft and a motor, the facing surface is recessed upward from the upper surface of the substrate to define a drying chamber, and the drying head comprises an exhaust port which is disposed in a ceiling portion of the drying chamber and exhausts the drying chamber.

15. A substrate processing apparatus comprising:
a spin chuck which holds a substrate horizontally;
a low surface tension liquid nozzle which supplies a low surface tension liquid having a lower surface tension than water onto an upper surface of the substrate held by the spin chuck;
an opening forming unit which forms an opening in a central region of a liquid film of the low surface tension liquid formed on the upper surface of the substrate held by the spin chuck;
a drying head which has a facing surface facing the upper surface of the substrate held by the spin chuck, and having a smaller planar view size than the substrate, and dries the upper surface of the substrate by forming a low-humidity space between the facing surface and the upper surface of the substrate, the low-humidity space having a humidity lower than a humidity outside the space; and
a drying head moving unit which moves the drying head along the upper surface of the substrate held by the spin chuck,
wherein the opening forming unit comprises at least one of an inert gas nozzle which supply an inert gas to the central region of the liquid film of the low surface tension liquid, and a lower nozzle which supplies a heating fluid to a lower surface of the substrate held by the spin chuck, the drying head moving unit comprises a pivot shaft and a motor, the drying head comprises a heater unit which heats the upper surface of the substrate, the low surface tension liquid nozzle is fixed to the drying head and comprises a discharge port which is opened at the facing surface.

16. The substrate processing apparatus according to claim 15, wherein the facing surface is a flat surface parallel to the upper surface of the substrate.

17. The substrate processing apparatus according to claim 15, wherein the facing surface is recessed upward from the upper surface of the substrate to define a drying chamber.

18. The substrate processing method according to claim 17, the facing surface has a first surface which is defined by a lower surface of the drying head and a second surface which is defined by a ceiling portion of the drying chamber, and the discharge port of the low surface tension liquid nozzle is opened at the first surface.

19. The substrate processing apparatus according to claim 17, wherein the drying head is an inert gas supply head which supplies an inert gas.

20. The substrate processing apparatus according to claim 19, wherein the inert gas supply head comprises an inert gas introduction port which supplies an inert gas to the drying chamber.

21. The substrate processing apparatus according to claim 20, wherein the inert gas supply head further comprises an exhaust port which exhausts the drying chamber.

22. The substrate processing apparatus according to claim 19, wherein the inert gas supply head further comprises an exhaust port which exhausts the drying chamber.

* * * * *